United States Patent
Ouellet et al.

(10) Patent No.: US 7,138,293 B2
(45) Date of Patent: Nov. 21, 2006

(54) WAFER LEVEL PACKAGING TECHNIQUE FOR MICRODEVICES

(75) Inventors: Luc Ouellet, Granby (CA); Jules J Poisson, Canton de Shefford (CA)

(73) Assignee: Dalsa Semiconductor Inc., Waterloo (CA)

(*) Notice: Subject to any disclaimer, the term of this patent is extended or adjusted under 35 U.S.C. 154(b) by 112 days.

(21) Appl. No.: 10/310,814

(22) Filed: Dec. 6, 2002

(65) Prior Publication Data
US 2004/0067604 A1    Apr. 8, 2004

Related U.S. Application Data

(60) Provisional application No. 60/415,782, filed on Oct. 4, 2002.

(51) Int. Cl.
*H01L 21/44* (2006.01)

(52) U.S. Cl. ............. 438/106; 438/118; 438/121; 438/51

(58) Field of Classification Search ........ 438/106–127, 438/48–55
See application file for complete search history.

(56) References Cited

U.S. PATENT DOCUMENTS

2002/0071169 A1    6/2002 Bowers et al.
2002/0096421 A1*   7/2002 Cohn et al. .................. 200/181
2002/0179986 A1* 12/2002 Orcutt et al. ............... 257/417
2003/0116845 A1*   6/2003 Bojkov et al. .............. 257/738
2003/0151479 A1*   8/2003 Stafford et al. ............... 335/78

FOREIGN PATENT DOCUMENTS

WO    WO 01/98786 A1    12/2001
WO    WO 02/42716 A2     5/2002

* cited by examiner

*Primary Examiner*—H. Jey Tsai
(74) *Attorney, Agent, or Firm*—Marks & Clerk; Richard J. Mitchell

(57) ABSTRACT

A method is disclosed for fabricating a integrated device, such as a MEMS device. A first wafer is provided on an exposed surface with a layer of gold, gold alloy or gold compound. A second wafer is provided on its exposed surface with under-layer of gold, gold alloy or gold compound; and an over- of bismuth, bismuth alloy, a compound of bismuth, cadmium, cadmium alloy, a compound of cadmium compound, tin, tin alloy, or a compound of tin. The wafers are then brought into contact and bonded at their surfaces through the deposited layers.

55 Claims, 30 Drawing Sheets

Glass frit bonding

Gyroscope
Cap wafer (opened for demonstration)
Glass frit bonding

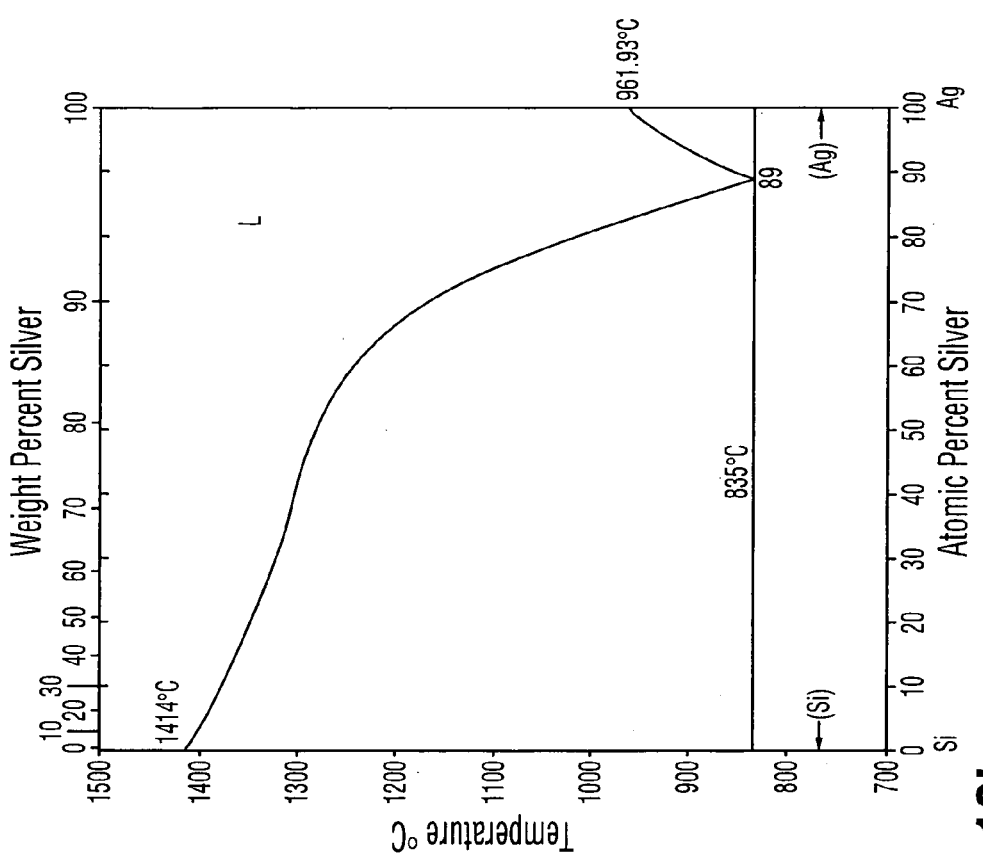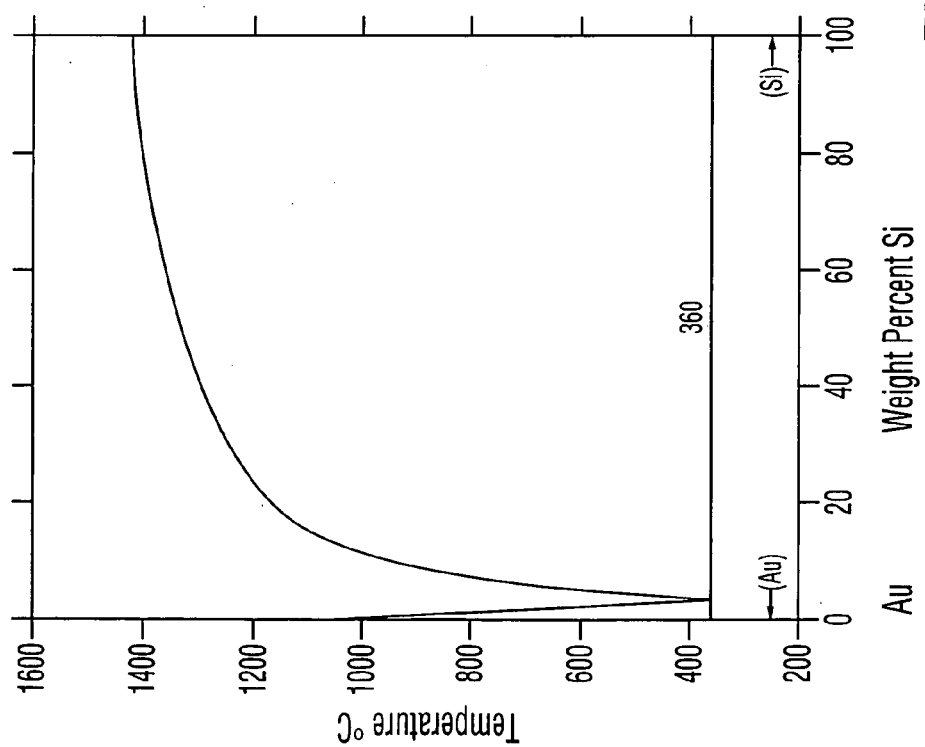
FIG. 10b

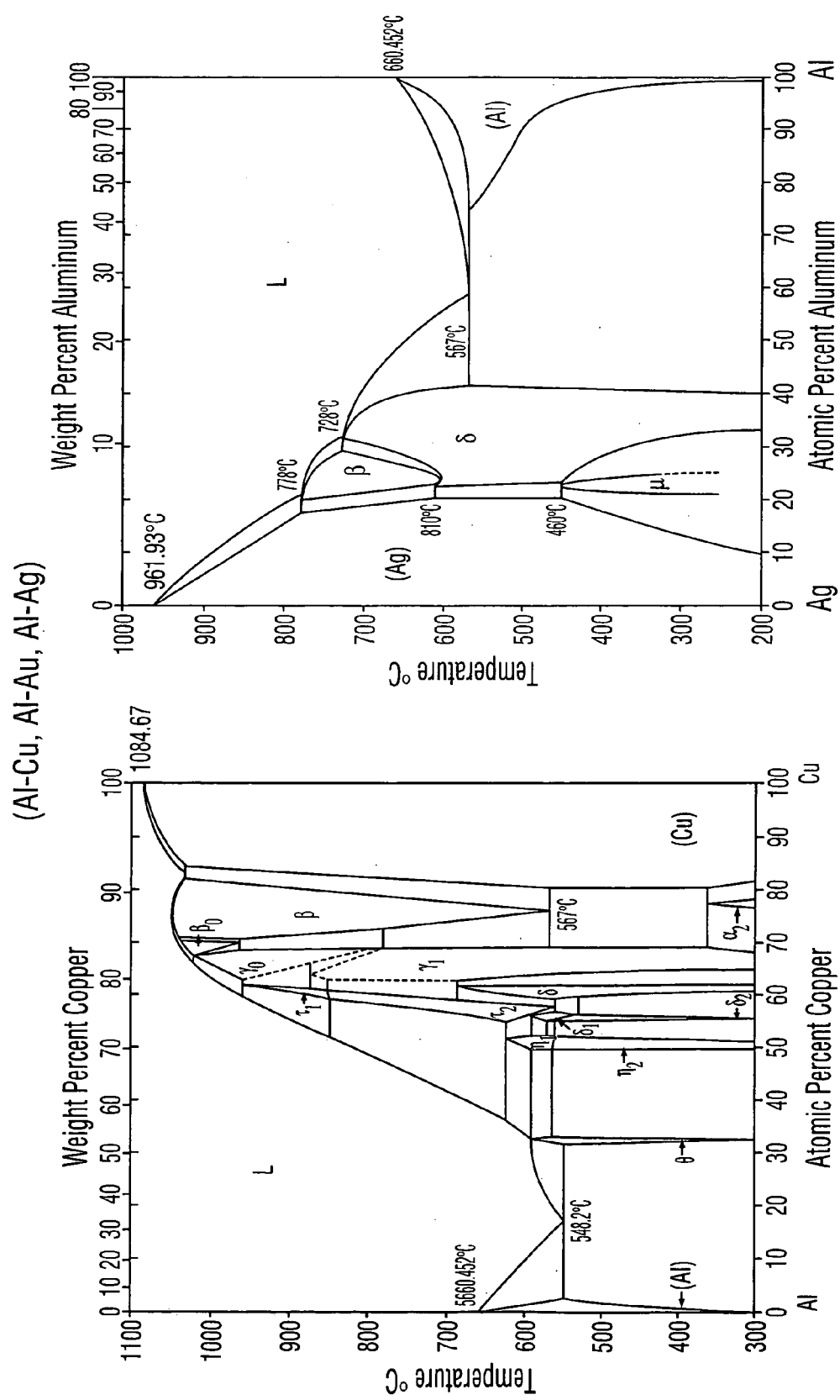
FIG. 11 (Al-Cu, Al-Au, Al-Ag)

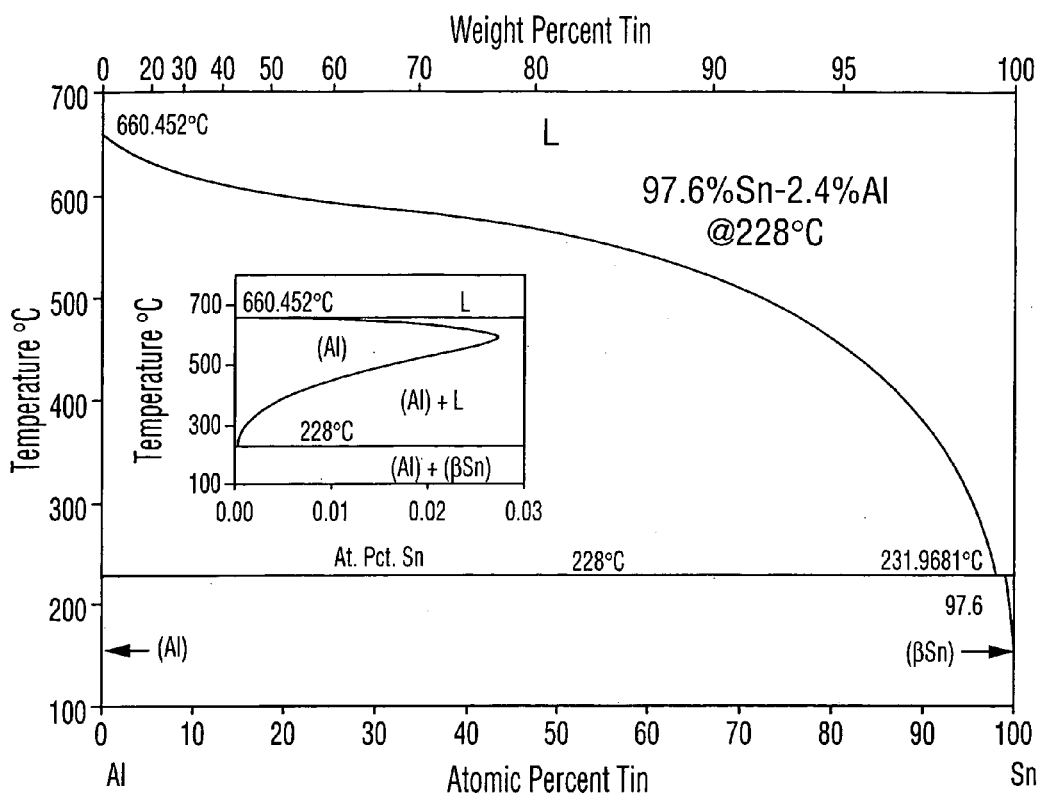
FIG. 32a
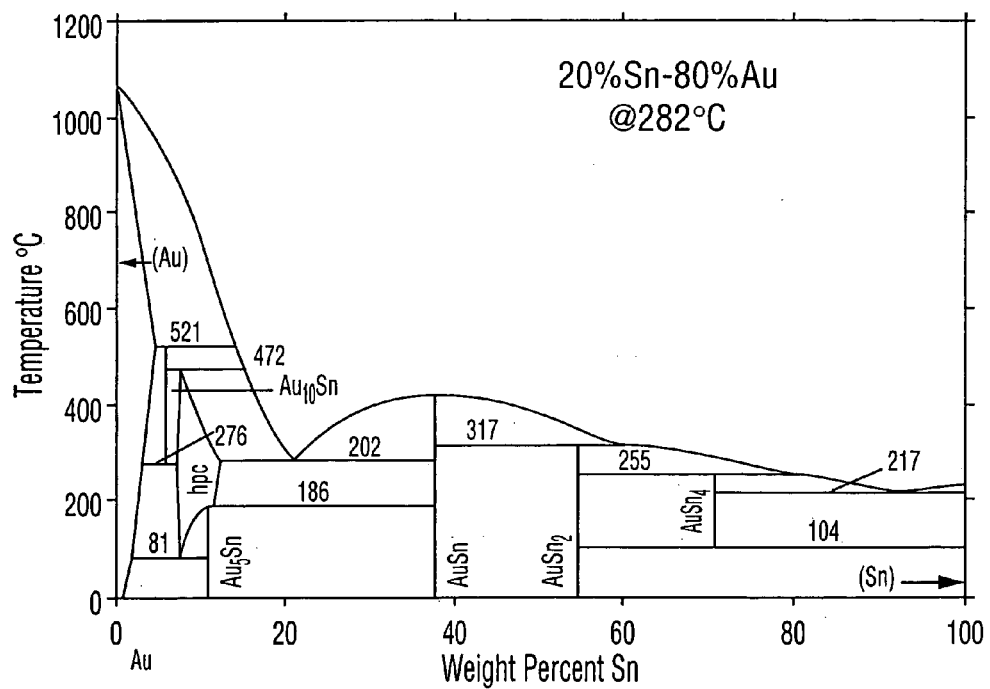

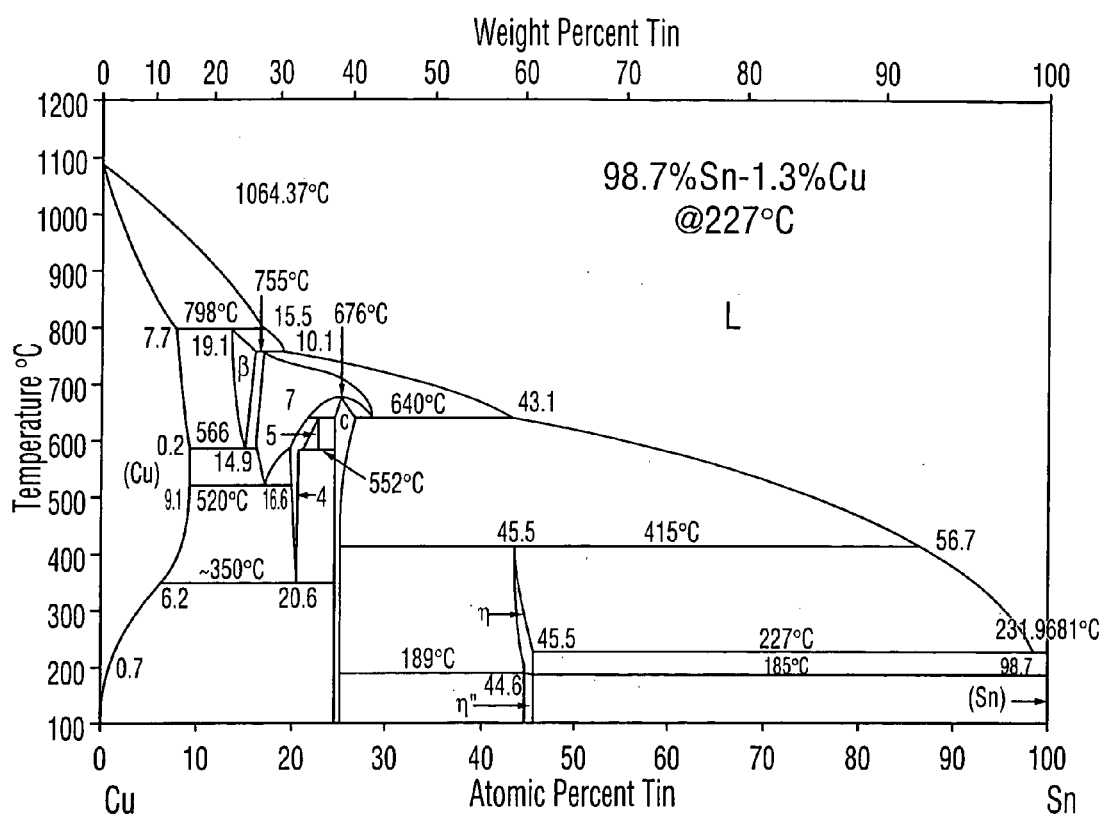
FIG. 32b
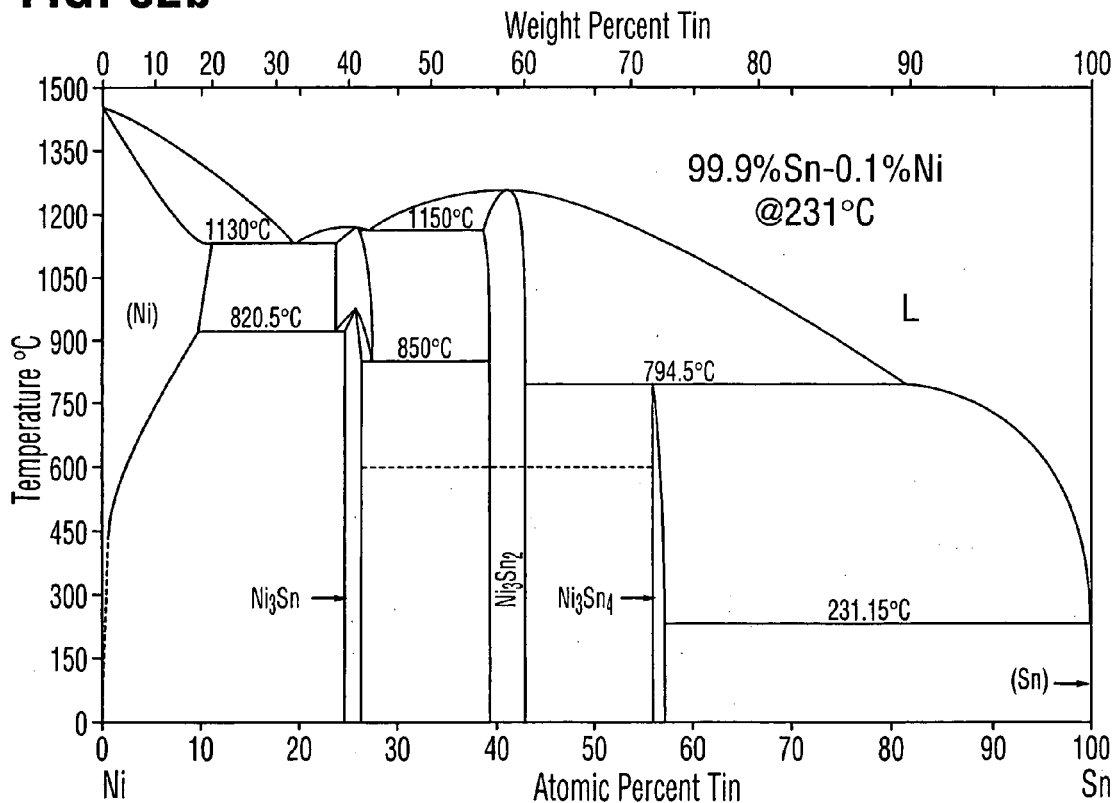

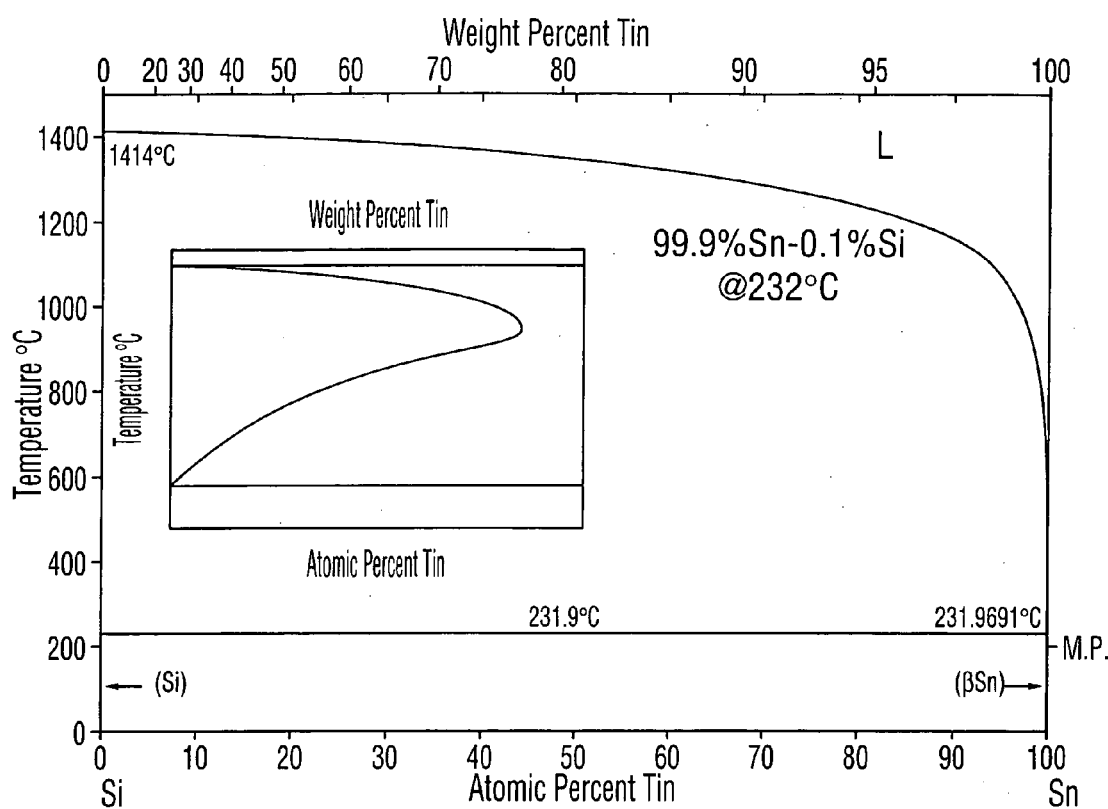
FIG. 32c
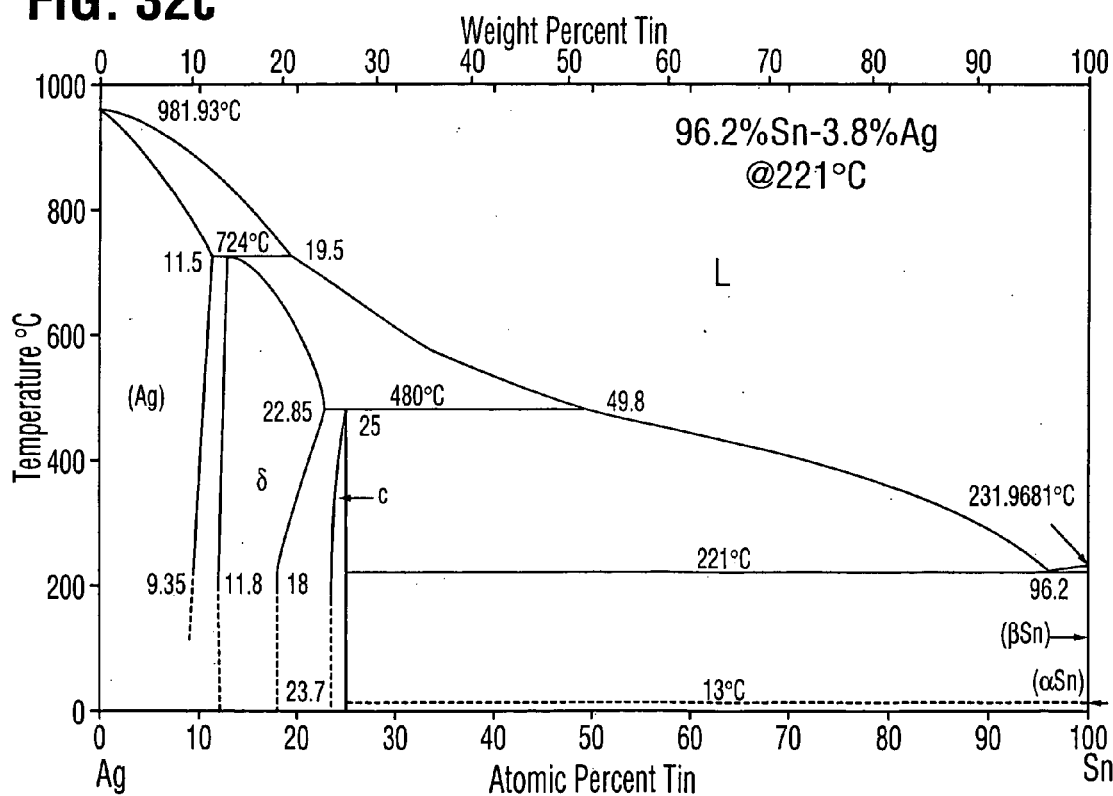

US 7,138,293 B2

WAFER LEVEL PACKAGING TECHNIQUE FOR MICRODEVICES

CROSS REFERENCE TO RELATED APPLICATION

This application claims the benefit under 35 USC 119(e) of U.S. provisional patent application No. 60/415,782 filed Oct. 4, 2002.

BACKGROUND OF THE INVENTION

1. Field of the Invention

The present invention relates to the field of integrated microdevices, such as, but not exclusively, Micro-Electro-Mechanical-Systems (MEMS), and in particular to a novel method of fabricating such devices at the wafer level. The invention is also applicable to the fabrication of biochips and like microdevices.

2. Description of Related Art

The manufacture of MEMS devices, such as microgyroscopes, micro-accelerometers, resonant accelerometers, micro-mirrors, micro-motors, micro-actuators and other such micro-devices integrating at least one moving part presents a very serious challenge in terms of packaging. A batch of such devices is fabricated on a wafer using semiconductor technology. The wafer is then diced to form the individual devices. Some MEMS-based devices require the encapsulation (known as wafer level packaging) to be done prior to dicing so that they are protected against contamination from particles and dicing slurry while during subsequent processing without the need for dedicated equipment or processes for dicing, mounting and molding procedures inside clean rooms. In addition, changes in atmospheric conditions can change the capacitance readout of microgyroscopes and micro-accelerometers without any corresponding change in acceleration, and because an increased relative humidity can increase stiction (that is the tendency of the moving parts to stick) of their moving parts, it is necessary to encapsulate the moving parts in a vacuum or in a controlled atmosphere.

In order to ensure the above functions, the moving parts are typically enclosed in a sealed micro-cavity under vacuum or under a specific pressure of dry nitrogen, dry forming gas or dry sulfur hexafluoride ambient. This is achieved by bonding two substrates together.

Since many MEMS devices must be operated under a high vacuum for ten years or more at a temperature of up to 150° C., the wafer-level packaging should allow the internal materials of the two substrates to be vacuum treated at a temperature much higher than the maximum operation temperature of 150° C. prior to sealing the wafer-level package under a vacuum in order to reduce the release of water vapor, hydrogen or other gases from these internal materials through this ten years period. In order to maintain the throughput of such vacuum wafer-level packaging process, this vacuum treatment at a temperature of about 400° C. should be followed by the wafer-level packaging bonding at a bonding temperature not too low compared to the 400° C. vacuum treatment so as to minimize the delays due to the cooling of the two substrates to the bonding temperature. A vacuum wafer-level packaging bonding temperature of 300–400° C. would be ideal for these applications.

However, many MEMS devices do not require to be operated under vacuum, and since many of these are very sensitive to the various coefficients of thermal expansion, it would also be desirable to develop an optional lower temperature wafer-level packaging process, which also guarantees reliable service for the expected life of the MEMS device in less stringent situations. Since the typical life of most semiconductor applications is about 10 years up to an operation temperature of up to 150° C., the lower temperature limit of the lower temperature wafer-level packaging process (the temperature at which de-bonding may occur) should not be lower then about 200° C. A non-vacuum wafer-level packaging bonding temperature of 175–300° C. would then be ideal for these applications.

The mechanical component or moving part of a MEMS device is mechanically released from surrounding materials so that it becomes relatively free to move and perform its sensing and/or actuation function. Wafer-level packaging involves the bonding of a sealed protective cap over this mechanical component following its mechanical release from its surrounding materials. Since such MEMS devices are typically fabricated from the combination of various materials having different coefficients of thermal expansion, it is important to minimize the exposure of the MEMS devices to high temperatures since this released component may be affected by the mechanical effects resulting from these various coefficients of thermal expansion Such effects can be observed as out-of-specification sensing or actuation, induced flexion and ultimately stiction between the released component and its surrounding materials, induced mechanical stress or mechanical failures in the released component, and unreliable performance in the field. In order to minimize these undesirable effects, it is necessary to minimize the temperature at which the mechanical component is exposed following its mechanical release from its surrounding materials. An upper limit of about 400° C. is desirable. Such an upper limit of 400° C. clearly limits the use of the well known direct wafer bonding (DWB) technique, which requires a temperature of about 1000 to 1200° C. to bond two polished silicon surfaces. Other lower temperature processes have been developed and are discussed herein. Unfortunately, none of these processes satisfy all the requirements for these special situations.

U.S. Pat. No. 6,232,150 titled 'Process for making microstructures and microstructures made thereby' (The Regents of the University of Michigan) as shown in FIG. 1, discloses the local bonding of Dow Corning's Pyrex 7740 glass to a phosphosilicate structure layer at a local temperature ranging between 820° C. and 1300° C. using an underlying polysilicon-based resistive micro-heater capable of locally heating the phosphosilicate bonding material to a high enough temperature as to allow bonding to the upper Pyrex 7740 glass. This reference employs a bonding temperature that is way over the desired upper limit of 400° C. It uses a temperature gradient which is necessarily associated with a mechanical stress gradient in the surrounding structures. Pyrex™ 7740 glass contains a lot of sodium in the form of $Na_2O$ and is thus absolutely incompatible with a CMOS line of products. This very serious limitation implies that the fabrication MEMS devices using in accordance with this reference must be limited to a dedicated tool set and cannot simply be introduced into a standard CMOS production line. Moreover, it also implies that this cited Pyrex-based wafer-level packaging technique will limit the development of future MEMS devices integrating optional sensing, control or communication devices and optional high-voltage actuation drivers.

While this patent requires the use of undesirable glasses, the process described is carried out at an excessive local temperature ranging between 820° C. and 1300° C., which may cause undesirable mechanical stress gradient in the surrounding structures.

U.S. Pat. No. 5,952,572 titled 'Angular rate sensor and acceleration sensor' (Matsushita Electric Industrial Co., Ltd.) is shown in FIG. 2. Three substrates composing the angular rate sensor described in U.S. Pat. No. 5,952,572 are bonded together as a sandwich structure using anodic bonding, as mentioned in column 7, lines 36–41 of the patent. This anodic bonding requires a Pyrex glass and the silicon and glass substrates to be heated to about 360° C. in a vacuum while a negative voltage of about 1000V is applied to the glass substrate with respect to the silicon substrate to be bonded with it.

This reference also uses $Na_2O$-containing Pyrex glass and is thus also incompatible with CMOS technology. It also limits the development of future MEMS devices integrating optional sensing, control or communication devices and optional high-voltage actuation drivers. Since it requires the use of anodic bonding, it is also undesirable in most situations because substrates have to avoid contaminating the fabrication toolset with undesirable elements in the bonded glass.

FIG. 3 illustrates a Samsung process described in B. Lee, S. Seok, J. Kim, and K. Chun, 'A mixed micromachined differential resonant accelerometer', Work supported by ADD (Agency for Defense Development) through ACRC (Automatic Control Research Center) under Grant AC-041 and by the Brain Korea21 Project. Samsung employs a vacuum packaging technique again using the anodic bonding of a handle glass wafer to a Chemical-Mechanical Polished (CMP) 6 μm thick polysilicon layer deposited on a previously deposited and patterned TEOS (tetraethylorthosilicate) sacrificial layer.

FIG. 4 illustrates another Samsung process described in B. Lee, C. Oh, S. Lee, Y. Oh and K. Chun, 'A vacuum packaged differential resonant accelerometer using gap sensitive electrostatic stiffness change effect', Work supported by ADD (Agency for Defense Development) through ACRC (Automatic Control Research Center) under Grant AC-041. FIG. 4 shows that Samsung discloses another approach again using the anodic bonding of two substrates to produce accelerometers affected by the presence of residual gas (air) causing an observed damping effect. This paper clearly explains the effect or residual gases on the performance of MEMS devices and clearly explains the need for a vacuum sealed wafer-level package for such applications. Again, the use of this anodic bonding approach using sodium-based Pyrex glass is incompatible with CMOS technology and limits the development of future MEMS devices integrating optional sensing, control or communication devices and optional high-voltage actuation drivers.

The low-temperature bonding technology of Samsung Corporation also requires the use of anodic bonding.

FIGS. 5 and 6 show the surface micromachining performed at Robert Bosch GmbH. FIG. 5 shows that a glass frit technique is used to bond a 380 μm thick Cap wafer forming a 75 μm high protective cavity to ann-released section of a 10.3 μm thick polysilicon as to provide an hermetic seal. FIG. 6 shows the glass frit region between the protective Cap wafer and the substrate.

The glass frit technique typically requires a bonding temperature ranging between 350° C. and 475° C., and is slightly higher than the vacuum wafer-level packaging bonding temperature of 300–375° C. and certainly much higher than the non-vacuum wafer-level packaging bonding temperature of 175–300° C. Moreover, the vacuum performance of the dielectrics used in this glass frit bonding technique is questionable for vacuum wafer-level packaging bonding because low-temperature glasses are well known to be porous and thus not really suitable for use as vacuum-tight materials. A metal-based bonding technique compatible with vacuum applications would be preferred.

FIG. 7 is taken from U.S. Pat. No. 5,668,033 titled 'Method for manufacturing a semiconductor acceleration sensor device'. FIG. 7 shows that a machined cap silicon wafer covered with gold can be bonded to the silicon layer of a silicon-on-insulator (SOI) substrate in order to protect the underlying released MEMS structure.

FIG. 8 shows a gold-silicon phase diagram taken from the http://metal.or.kr/college/m etc/ele-index.html. This gold-silicon phase diagram indicates that when a clean oxide-free silicon surface is brought into intimate contact with a gold surface at a temperature of more than 360° C., a liquid silicon-gold eutectic phase will appear at the interface. Cooling the interface to a temperature lower than 360° C. will result in bonding.

This process described in this document indicates that an underlying silicon oxide diffusion barrier layer is formed on the bottom surface of the machined cap silicon wafer to prevent the diffusion of gold into the silicon of this machined cap silicon wafer and the associated voids thus created during the bonding process (column 7, lines 18–30). In order to enhance the adhesion of gold on this underlying oxide layer, a 0.1 μm thick titanium, nickel or chromium adhesion layer is deposited between the oxide diffusion barrier layer and the 2 to 5 μm thick gold layer deposited by a plating technique. The patterning of 100 to 300 μm wide gold bonding patterns is then performed using standard photolithography (column 6, lines 28–43).

This reference also indicates that these 100 to 300 μm wide gold bonding patterns are faced and aligned to corresponding silicon patterns of slightly larger width under vacuum or inert-gas atmosphere at a prescribed pressure and then pressed at a temperature of about 400° C. using a force of about 0.2 to 1.0 $kg/mm^2$ for a period of tens of minutes before cooling below the eutectic temperature of 363° C.

The underlying silicon oxide diffusion barrier layer formed on the bottom surface of the machined cap wafer to prevent the diffusion of gold during the bonding process in undesirable for several reasons. Firstly, it constitutes another potential source of hydrogen or water vapor which limits the life of the sealed device. It decreases the infrared transparency of the overlying silicon substrate and then prevents the use of this wafer-level packaging technique for MEMS-based optical telecommunication switches operating in the C-Band (1300 nm), L-Band (1550 nm) and L-Band (1625 nm). It implies the contamination of a wet etch tool with gold if the underlying silicon oxide layers needs to be removed (i.e. as, for example, to allow the wafer-level packaging to be used for telecommunication infrared switches). In fact, this barrier layer is not really necessary because there are metal-based barrier metals which can be used under the gold layer and over the silicon layer to eliminate the interaction between gold and the silicon of the machined cap silicon wafer during the bonding process.

The photolithography of the gold layer, of the underlying 0.1 μm thick titanium, nickel or chromium adhesion layer and of the underlying silicon oxide diffusion barrier layer is undesirable because it implies gold contamination of the following of the equipment typically located in the CMOS fabrication area, namely the photoresist coater, scanner or stepper exposure equipment, develop equipment, etcher, photoresist stripper and surface cleaner.

FIG. 9 is taken from U.S. Pat. No. 6,265,246 titled 'Microcap wafer-level package' (Agilent Technologies, Inc.). The base wafer integrating a micro-device described in this patent is bonded to a matching cap wafer using cold welding of the bonding pad gaskets of the cap wafer to the periphery of the bonding pads of the base wafer integrating the micro-device. The arrangement assures an hermetic seal of the wafer-level package and electrical connections to the micro-device without passing through a seal. The bonding pads and bonding gaskets are selected from the following list of materials: silicon, aluminum, copper, gold, silver, alloys of these or compounds of these.

The following is the list of the possible binary combinations of bonding pairs of elements disclosed by Agilent's U.S. Pat. No. 6,265,246: silicon-aluminum; silicon-copper; silicon-gold; silicon-silver; aluminum-copper; aluminum-gold; aluminum-silver; copper-gold; copper-silver; gold-silver;

FIG. 10 shows the phase diagrams of the upper four pairs of elements involving silicon (silicon-aluminum; silicon-copper; silicon-gold; silicon-silver), as found at http://metal.or.kr/college/m etc/ele-index.html.

The silicon-aluminum pair has an eutectic temperature of about 580° C. The silicon-copper pair has an eutectic temperature of about 802° C. The silicon-gold pair has an eutectic temperature of about 360° C. and the silicon-silver pair has an eutectic temperature of about 835° C. It is clear that, out of these four pairs, the most interesting is still the silicon-gold pair, already disclosed by Nippon Denso's U.S. Pat. No. 5,668,033.

FIG. 11 shows the phase diagrams of two out of the three other pairs of elements involving aluminum (aluminum-copper; aluminum-gold; aluminum-silver), that can be found at http://metal.or.kr/college/m etc/ele-index.html.

The aluminum-copper pair has an eutectic temperature of about 548° C. The aluminum-gold pair is unstable and results in the so called purple plague. The aluminum-silver pair has an eutectic temperature of about 567° C. It is clear that none of these pairs is more interesting than the silicon-gold pair already disclosed by Nippon Denso's U.S. Pat. No. 5,668,033.

FIG. 12 shows the phase diagrams of the two other pairs of elements involving copper (copper-gold; copper-silver). The copper-gold pair has an eutectic temperature of about 910° C. The copper-silver pair has a eutectic temperature of about 780° C. It is clear that none of these pairs is more interesting then the silicon-gold pair already disclosed by Nippon Denso's U.S. Pat. No. 5,668,033.

FIG. 13 shows the phase diagrams of the remaining pair of elements involving gold (gold-silver. It is clear that the gold-silver pair is not more interesting then the silicon-gold pair already disclosed by Nippon Denso's U.S. Pat. No. 5,668,033.

None of the metal combinations disclosed in the U.S. Pat. No. 6,265,246 has a eutectic temperature lower than the silicon-gold pair already disclosed by Nippon Denso's U.S. Pat. No. 5,668,033.

Contrary to previously discussed Nippon Denso's U.S. Pat. No. 5,668,033, U.S. Pat. No. 6,265,246 does not describe the use of an underlying silicon oxide diffusion barrier layer formed on the bottom surface of the 200 μm thick matching cap wafer to prevent the diffusion of gold during the bonding process. The elimination of the silicon oxide diffusion barrier layer eliminates the potential source of hydrogen or water vapor which limits the life of the sealed device. It also prevents the decrease of the infrared transparency of the overlying silicon substrate and allows the use of this wafer-level packaging technique for MEMS-based optical telecommunication switches operating in the C-Band (1300 nm), L-Band (1550 nm) and L-Band (1625 nm). Finally, the elimination of the silicon oxide diffusion barrier layer prevents the contamination of a wet etch tool with gold if the underlying silicon oxide layers needs to be removed (for example, to allow the wafer-level packaging to be used for telecommunication infrared switches).

FIG. 14 shows the process sequence described by Agilent Technologies for the fabrication of a matching cap wafer. A first coat of photoresist is coated onto the silicon wafer, exposed and developed. A deep silicon etch is performed so as to penetrate about 100 μm into the 200 μm thick silicon wafer and produce a series of deep trench patterns. Following photoresist stripping, a very thin diffusion barrier layer of chromium, nickel or titanium is deposited by sputtering just before the in-situ deposition, in the same sputtering equipment, of a 0.2 to 0.3 μm of gold seed layer (column 4, lines 1 to 9). A second pattern of thick high-viscosity photoresist is then coated, exposed and developed onto this gold seed layer to allow the electroplating of a thick pattern of gold into the developed pattern of photoresist, using the seed gold layer as electrode. Following plating, the photoresist is removed using conventional photoresist stripping, thus leaving a gold pattern whose thickness is only limited by the thickness of the high-viscosity photoresist. The remaining gold seed layer and metal-based diffusion barrier layer are etched away using a conventional etching process. The passages at column 4, lines 60 to 67, and column 5, lines 1 to 11 teach that, an adhesion layer (not shown) can be deposited on the base wafer and that an unspecified material be deposited by sputtering or evaporation. Patterning is done by photolithography, the unwanted unspecified conductive material is etched away, and the photoresist is removed. Alternately, the photolithography is performed, followed by the deposition of the adhesion layer and the unspecified conductive material, followed by the removal of the photoresist material and of the unwanted unspecified conductive material to form the bonding pads.

As described in column 5, lines 12 to 18, and as shown in FIG. 15 the matching cap wafer is turned-over and aligned to the base wafer and compressed together at temperatures up to 350° C. until "cold weld" bonding occurs for the gold plated pattern of the matching cap wafer to bond to the unspecified material of the bonding pad of the base wafer and create a completely hermetically sealed volume for the protected microdevice. The matching cap wafer is then thinned using conventional wafer grinding or lapping and polishing so that the previously deep etched trench patterns extend all the way through the matching cap wafer.

The above description of the bonding technique does not allow a person skilled in the art of bonding to reproduce the results stated without knowing the nature of the material deposited on the base wafer the technique used to "remove" this unwanted material following photoresist removal.

FIG. 16 is taken from U.S. Pat. No. 6,297,072. FIG. 16 shows that the so called "Indent-Reflow-Sealing" (IRS) technique described in this patent uses a first chip located on a first substrate fabricated by depositing and patterning a metallization seed layer; preparing a polyimide mold to define the solder ring; and electroplating the solder ring in the mold using an optional nickel spacer whose thickness is only limited by the thickness of the polyimide mold. Preferably the eutectic 63% tin-37% lead solder, but alternately one of the following solders: 5% tin-95% lead, tin-lead-2% Silver, indium, 80% gold-20% tin, tin-silver, tin-silver-copper or tin-bismuth can be used. After removal of the polyimide mold, a shearing tool or an indenter is used to create an indent region in the electroplated solder ring, as shown in FIG. 17. This indent later disappears during the later reflow of this solder ring.

A second chip located on second substrate is then fabricated. As shown in FIG. 18, first there is carried out the deposition and patterning of a suitable metal ring adequately wettable and capable of forming a stable intermetallic compound with the electroplated (electrodeposited) solder ring of the first chip of the first substrate. Examples of a suitable metal ring are most stable tin-copper or alternately, tin-nickel covered with a thin layer of 0.1–0.3 μm of gold to prevent nickel oxidation. A tin-nickel/gold metal ring with a gold layer thicker than 0.3 μm will result in an unreliable solder connection.

A pre-treatment "flip-chip" alignment is carried out after suitable plasma treatment of both substrates to enhance adhesion following reflow of the solder ring. As shown in FIG. 19, a flip-chip aligner and bonding system is used to make the solder ring of the first chip of the first substrate face and be aligned with the metal ring of the second chip of the second substrate.

As a pre-bonding step, both chips are heated to a temperature well below the melting point of the solder ring (a softening temperature well below the reflow temperature), such as 120–160° C. for a 67% tin-37% lead. Pre-bonding is then carried out by the application of a bonding force (typically 2 kgf or 19.62 N) for the two chips of the two substrates so that they stick as shown in FIG. 20. This allows the pair to be moved to the reflow oven. The temperature and bonding force is optimized for the chosen solder ring, the solder ring history and the type of metal ring used.

In the reflow oven, the cavity formed between the aligned and pre-bonded solder ring and metal ring is evacuated and then filled with the required pressure of desired gas, such as nitrogen, nitrogen-hydrogen mixtures or sulphur hexafluoride. Alternately, the vacuum cavity can be vacuum evacuated. FIG. 21 shows that the evacuation and filling of the cavity is performed through the indent region previously created in the solder ring.

The temperature of the oven is raised to about or above the melting point of the solder ring but below the melting point of all other materials used. As shown in FIG. 22, the solder ring melts to close the indent region resulting in a hermetically sealed cavity with a controlled ambient. The result is the eutectic bonding between the electroplated 67% tin-37% lead solder ring and the 0.1–0.3 μm gold layer of the tin-nickel/gold metal ring.

This patent then describes the bonding of an indented 63% tin-37% lead, 5% tin-95% lead, tin-lead-2% silver, indium, 80% gold-20% tin, tin-silver, tin-silver-copper or tin-bismuth solder ring electroplated over an optional electroplated nickel spacer of a first substrate to a tin-copper or tin-nickel/gold metal ring of a second substrate using two pieces of equipment: a single-wafer pre-bonder and a batch oven to seal the indented solder ring by reflow under a controlled pressure of nitrogen, nitrogen-hydrogen or sulphur hexafluoride or under vacuum.

The use of the solder ring on the first substrate allows the bonding to the tin-copper or tin-nickel/gold metal ring of the second substrate to be performed at temperatures that are much lower then the gold-silicon eutectic temperature of 363° C.

Unfortunately, there are a couple of issues with the above bonding strategy. It is yet not clear which of the two substrates (the substrate with the solder ring or the substrate with the metal ring) would integrate the MEMS structure to be mechanically released using vapor HF. If it is the solder ring, then the electroplated solder material would be exposed to vapor HF. Unfortunately the exposure of a noble metal (such as gold) to vapor HF would be preferred. If it would be the tin-copper or tin-nickel/gold metal ring then either a tin-copper or tin-nickel/gold structure would then be exposed to vapor HF. The first tin-copper situation is undesirable because it does involve the exposure of a noble metal to vapor HF. The second tin-nickel/gold situation is more desirable because it implies that gold would be exposed to vapor HF. Unfortunately, the underlying metal would then be tin-nickel, which is not a desirable choice.

FIG. 23 shows the phase diagram of the tin-nickel system. FIG. 23 shows that the exposure of tin-nickel to temperatures in excess of 231° C. results in the formation of liquid tin under the gold layer, which is absolutely undesirable if the bonding is to be performed to the upper gold layer.

The above described technique requires the precise indentation of the solder ring to allow the two substrates to be aligned. They must then be pressed together, and heated to a softening temperature so as to stick the two substrates together in the alignment and pre-bonding equipment. This step is followed by the formal reflow of the solder ring at the required pressure of nitrogen, nitrogen-hydrogen or sulphur hexafluoride gas or under proper vacuum level in another batch reflow equipment. This complex indentation process, align-press-heating pre-bonding step in one equipment and this release of the applied force and reflow in an independent batch reflow equipment has a number of disadvantages. The process is very complex; of questionable reliability because the applied force is released before the actual reflow of the solder ring, thus allowing the various interfaces to be "de-stick" during manipulation and loading into the batch reflow oven; and unnecessarily costly to manufacture.

The review of the prior art indicates that it is associated with several problems. The well known direct wafer bonding (DWB) technique requiring a bonding temperature of about 1000 to 1200° C. operates at too a high temperature to be used for MEMS involving a mechanically released sensitive structure.

The technique described in U.S. Pat. No. 6,232,150 involving the bonding of Dow Corning's Pyrex 7740 glass using a polysilicon-based resistive micro-heater capable of locally bonding silicon to this $Na_2O$-based phosphosilicate requires an excessively high local temperature ranging between 820° C. and 1300° C. This technique is undesirable for many reasons: It causes undesirable mechanical stress gradients in the region of the mechanically released sensitive structure; its $Na_2O$-based Pyrex 7740 glass is absolutely incompatible with CMOS technology. It also limits the development of future MEMS devices integrating optional sensing, control or communication devices and optional high-voltage actuation drivers because its structural sodium contaminates the manufacturing equipment with sodium and results in devices affected by sodium-induced threshold voltage instabilities and sodium-induced slow trapping reliability problems.

The anodic bonding process described in U.S. Pat. No. 5,952,572 (Matsushita Electric Industrial Co., Ltd.) and in the two Samsung Prior Art publications B. Lee, S. Seok, J. Kim, and K. Chun, 'A mixed micromachined differential resonant accelerometer', Work supported by ADD (Agency for Defense Development) through ACRC (Automatic Control Research Center) under Grant AC-041 and by the Brain Korea21 Project; B. Lee, C. Oh, S. Lee, Y. Oh and K. Chun, 'A vacuum packaged differential resonant accelerometer using gap sensitive electrostatic stiffness change effect', Work supported by ADD (Agency for Defense Development) through ACRC (Automatic Control Research Center) under Grant AC-041; allows the reduction of the bonding temperature of the Na$_2$O-based Pyrex 7740 glass to about 360° C. using vacuum anodic bonding. This anodic bonding process has the same sodium-related contamination issues and the same limitations concerning the development of future MEMS devices integrating optional sensing, control or communication devices and optional high-voltage actuation drivers. Moreover, this technique requires the application of undesirable high voltage gradients (1000 to 2000 volts). Added to this sodium-based limitation, the anodic bonding process requires a 1000 to 2000 volts voltage drop to be applied between the Pyrex 7740 glass and the fresh silicon surface to be bonded.

A glass frit bonding technique reported by Robert Bosch GmbH in the following two prior art publications reduces the bonding temperature to a range between 350° C. and 475° C. This temperature is still slightly higher than the vacuum wafer-level packaging bonding temperature of 300–375° C. and certainly much higher then the non-vacuum wafer-level packaging bonding temperature of 175–300° C. Moreover, the vacuum performance of the dielectrics used in this glass frit bonding technique is questionable for vacuum wafer-level packaging bonding situations because low-temperature glasses are well known to be porous and not really suitable as vacuum-tight materials.

The silicon-gold eutectic bonding technique reported in U.S. Pat. No. 5,668,033 (Nippon Denso Co., Ltd.) describes a process involving the bonding of a cap silicon wafer to a base wafer. The bottom surface (bonding side) of the cap wafer is covered with a silicon oxide layer preventing the diffusion of gold into silicon and associated voids created during the bonding process. To enhance the adhesion of gold on this underlying oxide layer, a 0.1 µm thick titanium, nickel or chromium layer is deposited between the oxide diffusion barrier layer and the gold layer. Standard photolithography is used to pattern the gold bonding patterns before flipping the cap wafer, aligning the gold bonding patterns to the facing silicon patterns of the base wafer and pressing these gold patterns to these silicon patterns at a temperature of about 400° C. for tens of minutes before cooling below the eutectic temperature of 363° C. This fabrication technique of the cap silicon wafer and of the base silicon wafer (free from native oxide) has serious limitations which cannot provide a stable and repeatable bonding. This limitation is acknowledged by the inventors of this patent who describe the use of an hydrofluoric acid based etching solution to eliminate the natural oxide formed on the surface of these facing silicon patterns (column 5, lines 53 to 56). Since the base wafer typically incorporates hundreds of sensitive and mechanically released MEMS structures, it is generally not possible to use hydrofluoric acid based etching solutions because their surface tension will cause the surface of the released MEMS structure and the surface of surrounding structures to stick together, a well known problem in MEMS fabrication. Since this native oxide naturally re-grows in ambient conditions over a typical time period of a few hours (a time period equivalent to the bonding of a couple of pairs of wafers at a typical throughput of a few tens of minutes per pair of wafers) and since there are typically forty-eight wafers to bond in succession (one set of twenty-four cap wafers to bound to one set of twenty-four base wafers) the native oxide can then re-grow during delays between steps, during manipulations and even while bonding the first pairs of wafers. The eutectic bonding of gold to bare silicon is then a non-repeatable and unstable process requiring a lot of special precautions which, thus not desirable. If this MEMS device is a photonics MEMS device (such as a MEMS-based optical telecommunication switch) requiring the cap wafer to be infrared transparent in the C-Band (1300 nm), L-Band (1550 nm) and L-Band (1625 nm) then the underlying silicon oxide diffusion barrier layer formed on the bottom surface of the cap wafer as to prevent the diffusion of gold during the bonding process in also undesirable because it will increase the absorption loss of the switch. If the MEMS device is a vacuum-based automotive device such as a micro-gyroscope, then the presence of the underlying silicon oxide diffusion barrier layer formed on the bottom surface of the cap wafer will also constitute a potential source of hydrogen or water vapor which and then limit the life of the vacuum-sealed device. Finally, the use of standard photolithography to pattern the gold layer and the underlying 0.1 µm thick titanium, nickel or chromium adhesion layer is undesirable because it implies gold contamination of the following list of equipment typically located in the CMOS fabrication area: photoresist coater, scanner or stepper exposure equipment, develop equipment, etcher, photoresist stripper and surface cleaner.

U.S. Pat. No. 6,265,246 also describes a process involving the bonding of a cap silicon wafer to a base wafer. Unlike Nippon Denso's U.S. Pat. No. 5,668,033, Agilent Technologies' U.S. Pat. No. 6,265,246 describes the use of a very thin diffusion barrier layer of chromium, nickel or titanium as replacement of the silicon oxide diffusion barrier layer, thus eliminating the upper-described issues with this silicon oxide diffusion barrier. The analysis of the various phase diagrams shows that, out of the silicon-aluminum, silicon-copper, silicon-gold, silicon-silver, aluminum-copper, aluminum-gold, aluminum-silver, copper-gold, copper-silver and/or gold-silver possible bonding combinations reported in U.S. Pat. No. 6,265,246, the bonding combination providing the lowest possible bonding temperature is still silicon-gold, with an eutectic temperature of 363° C. Curiously, the passage at column 5, lines 12 to 18 states that the cap wafer is turned-over, aligned to the base wafer and compressed together at temperatures up to 350° C. until "cold weld" bonding occurs for the gold plated pattern of the matching cap wafer to bond to the unspecified material of the bonding pad of the base wafer and create a completely hermetically sealed volume for the protected micro-device. As previously mentioned, the bonding technique does not allow a person skilled in the art of bonding to understand the so-called "cold weld" at temperatures up to 350° C. or to reproduce the results of the patent. Since the "cold weld" temperature is lower than the silicon-gold eutectic temperature of 363° C., the pads cannot be covered by silicon and the wafer-level bonding cannot be performed by silicon-gold eutectic bonding.

The "Indent-Reflow-Sealing" (IRS) technique reported in U.S. Pat. No. 6,297,072 describes a process involving the bonding of an indented 63% tin-37% lead, 5% tin-95% lead, tin-lead-2% silver, indium, 80% gold-20% tin, tin-silver, tin-silver-copper or tin-bismuth solder ring electroplated over an optional electroplated nickel spacer of a cap wafer to a tin-copper or tin-nickel/gold metal ring of a base wafer using two pieces of equipment: a single-wafer pre-bonder and a batch oven to seal the indented solder ring by reflow under a controlled pressure of nitrogen, nitrogen-hydrogen or sulfur hexafluoride or under vacuum. The use of one of the proposed solder rings on the cap wafer allows the bonding to the tin-copper or tin-nickel/gold metal ring of the base wafer at a temperature which is much lower then the gold-silicon eutectic temperature of 363° C. There are a couple of issues with this metallurgical process. In order to release the mechanical structure of the MEMS, the metal ring of the base wafer has to be exposed to vapor HF prior to bonding the cap wafer. Unfortunately, if the metal ring of the cap wafer is the proposed tin-copper, then the exposure to vapor HF is undesirable because this tin-copper is not a noble metal. If the metal ring of the cap wafer is the proposed the tin-nickel/gold, then the exposure to vapor HF would be more desirable because gold is a noble metal not affected by vapor HF exposure. Unfortunately, this proposed tin-nickel/gold metal ring implies that the tin-nickel metal under the gold bonding layer can form liquid nickel at a temperature of only 231° C., which is absolutely undesirable if the bonding is to be performed to the upper gold layer. The required precise indentation of the solder ring allowing the two substrates to be aligned, pressed together and heated to a "softening temperature" as to "stick" the two substrates together in the alignment and pre-bonding equipment, followed by the formal reflow of the solder ring in another batch reflow equipment makes the proposed process very complex, very costly to manufacture and of questionable reliability because the applied force is released before the actual reflow of the solder ring, thus allowing the various interfaces to be "de-stick" during manipulation and loading into the batch reflow oven.

SUMMARY OF THE INVENTION

The present invention provides a new wafer-level packaging technique that can permit the alignment, vacuum release of water vapor, hydrogen or other gases and bonding, at a temperature of less than 400° C. and under vacuum or under a specific pressure of dry nitrogen, dry forming gas or dry sulfur hexafluoride ambient.

The invention uses a gold-silicon eutectic technique as a solution for the wafer-level bonding process but alleviates the afore-mentioned limitations and contamination issues, thus ensuring much lower cost processing and permitting the development of MEMS devices integrating optional sensing, control or communication devices and optional high-voltage actuation drivers.

In a broad aspect the present invention provides a method of fabricating a in integrated microdevice, comprising providing a first wafer having on a surface thereof a layer of material selected from the group consisting of: gold, gold alloy or gold compound; providing a second wafer with having on a surface thereof an under-layer of material selected from the group consisting of gold, gold alloy or gold compound; and an over-layer selected from the group consisting of bismuth, bismuth alloy, a compound of bismuth, cadmium, cadmium alloy, a compound of cadmium compound, tin, tin alloy, or a compound of tin; and bonding said wafers together at said surfaces thereof. The preferred material for the over-layer is bismuth, bismuth alloy, or a compound of bismuth.

The use of these metals allows the substrate to be exposed to vapor HF for the release of the MEMS mechanical structure.

The novel method can eliminate the extra cost of two pieces of bonding equipment by using an integrated scheme for pre-bonding and reflow/fusion.

In a preferred embodiment, the first wafer is in the form of a base wafer integrating at least one bonding pad and optional electronic circuitry located outside the sealed region, one or more components of the MEMS structure, which may include one or more moving parts, located inside the sealed region, an aluminum alloy or copper interconnect located at the perimeter of the sealed area, a nickel barrier layer selectively deposited over the aluminum alloy or copper interconnect using electroless plating through a temporary mask, and an anti-oxidation gold layer selectively deposited over the nickel barrier layer using immersion plating through a temporary mask and an alignment structure. The second wafer is in the form of a cap wafer integrating a metal-based interconnect located at the perimeter of the sealed area, an optional nickel layer selectively deposited over the metal-based interconnect using electrolytic plating through a temporary mask, a gold layer selectively deposited over the metal-based interconnect (or over the optional nickel barrier layer) using electrolytic plating through a temporary mask, and a layer, preferably a bismuth layer or alternately a cadmium layer, a tin layer or a lead-free tin-based solder layer (tin-silver-copper, tin-copper, tin-silver, tin-bismuth, tin-gold, tin) selectively deposited over the gold layer using electrolytic plating, an alignment structure and a recessed structure allowing the removal of the portion of the second wafer outside the sealed area.

The novel method thus employs the gold-silicon eutectic technique as one of the possible solution for the wafer-level bonding process and a novel combination of materials which allows the use of bonding temperatures lower than the gold-silicon eutectic temperature. These other materials are different from the disclosed gold, silicon, aluminum, copper, silver and alloys thereof and compounds thereof.

The novel method thus permits the production of a MEMS device wherein at least one bonding pad and optional control circuitry are located at least partially outside the sealed cavity created from the bonding of the base wafer to the cap wafer and wherein moving components of the MEMS structure are located in the sealed cavity created from the bonding of the base wafer to the cap wafer. This sealed vacuum or specific pressure of dry nitrogen, dry forming gas or dry sulfur hexafluoride ambient protects the moving component or other component of the MEMS device against micro-contamination from the particles and slurry of the following substrate dicing process, against fluctuations of the atmospheric conditions, against internal electrical discharge and ensures long-term reliability.

The novel method also provides a new wafer-level packaging technique involving the alignment, vacuum release of water vapor, hydrogen or other gases and bonding, at a temperature of less than 400° C. and under vacuum or under a specific pressure of dry nitrogen, dry forming gas or dry sulfur hexafluoride ambient.

In another aspect the invention provides a precursor assembly for making an integrated microdevice comprising a base wafer comprising: a zone to be sealed; a bonding pad located outside said zone; a component located inside said zone; a metal interconnect located at the perimeter of said zone; an anti-oxidation metal layer selectively deposited said metal barrier layer; and a cap wafer comprising: one or more of metal-based interconnects located at said zone; a metal layer selectively deposited over said metal-based interconnect; a gold layer selectively deposited over said metal-based interconnect; a solder layer selectively deposited over the gold layer; an alignment structure; and a recessed structure allowing the removal of the portion of the cap wafer outside said zone.

In a still further aspect the invention provides a method of fabricating an integrated microdevice, comprising the steps of fabricating a base wafer including a bonding pad located outside a zone to be sealed, a component inside said zone, a metal interconnect located at the perimeter of said zone, an anti-oxidation layer selectively deposited using immersion plating through a temporary mask, and an alignment structure; fabricating a cap wafer including a metal-based interconnect located at the perimeter of said zone, a gold layer selectively deposited over said metal-based interconnect using electrolytic plating through a temporary mask, a solder layer selectively deposited over the gold layer using electrolytic plating, an alignment structure and a recessed structure allowing the removal of the portion of this second wafer outside said zone; and bonding said cap wafer and said base wafer together using said solder layer.

BRIEF DESCRIPTION OF THE DRAWINGS

The invention will now be described in more detail, by way of example only, with reference to the accompanying drawings, in which:

FIG. 11 shows phase diagrams of two out of the three other binary aluminum combinations disclosed in Agilent's U.S. Pat. No. 6,265,246 (Al—Cu, Al—Au, Al—Ag);

FIG. 30b is a continuation of FIG. 30a;

FIG. 32 shows diagrams of tin-based metals having a eutectic ° T of less than 400° C.;

DETAILED DESCRIPTION OF THE PREFERRED EMBODIMENTS

Figure 1:
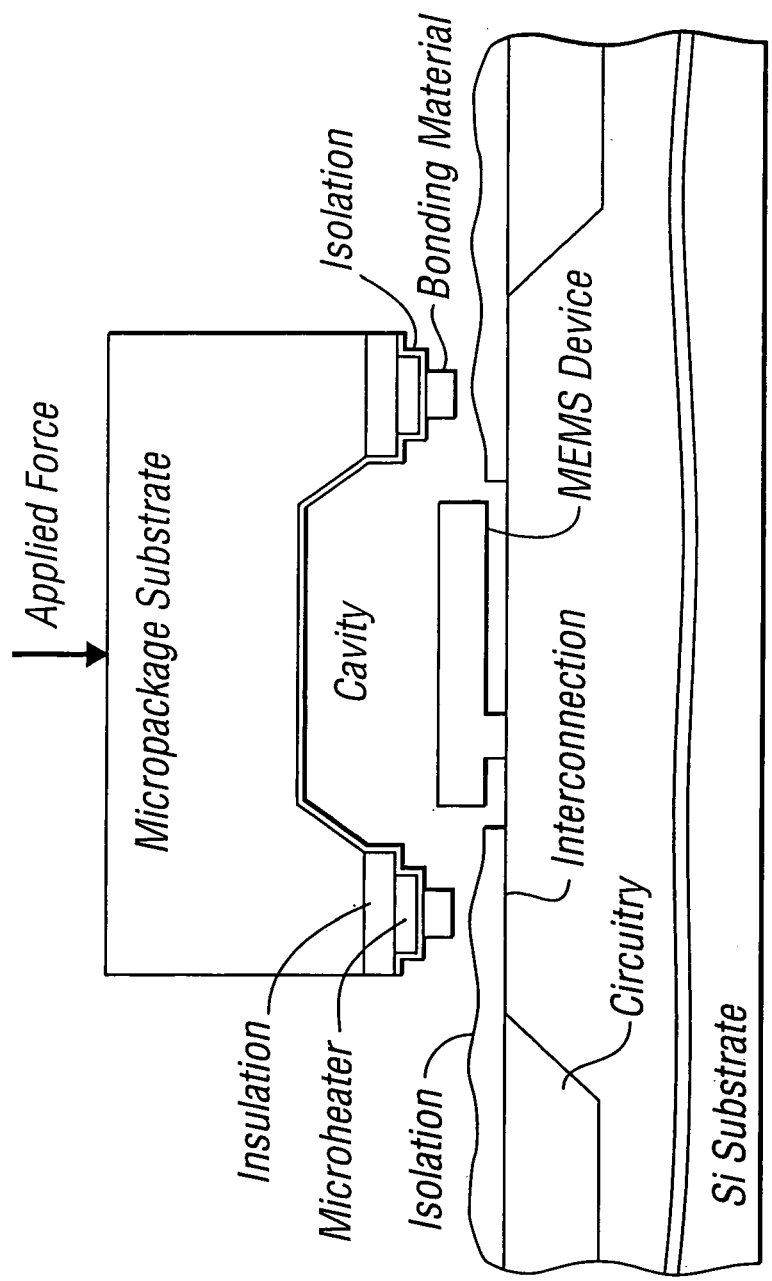
FIG. 1 shows the packaging of a microstructure via flip chip bonding using a bonding material and a metal-based localised micro-heater to locally heat the bonding material as illustrated in U.S. Pat. No. 6,232,150.
Figure 2:
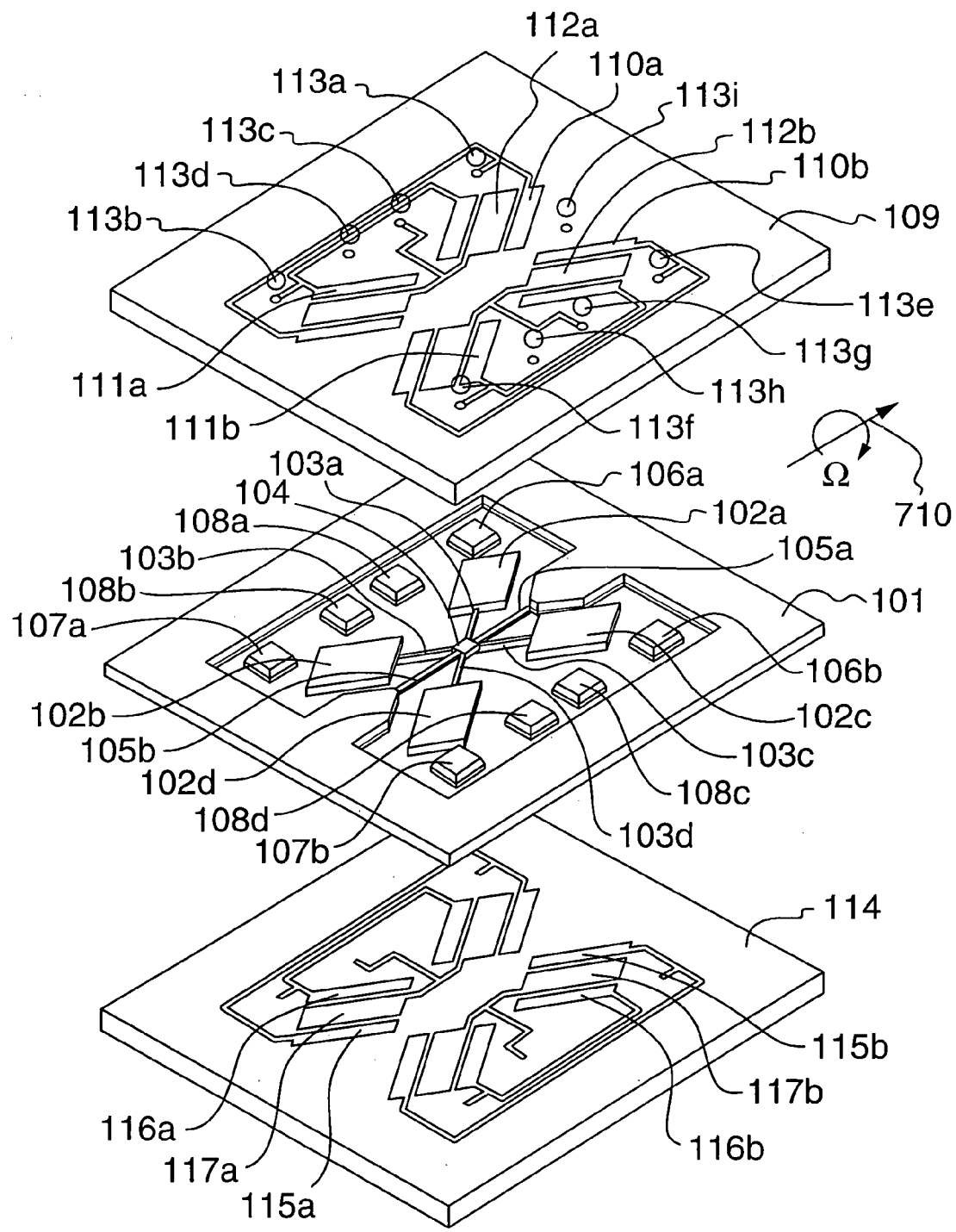
FIG. 2 shows the vacuum packaging of an angular rate sensor using anodic bonding as shown in U.S. Pat. No. 5,952,572.
Figure 3:
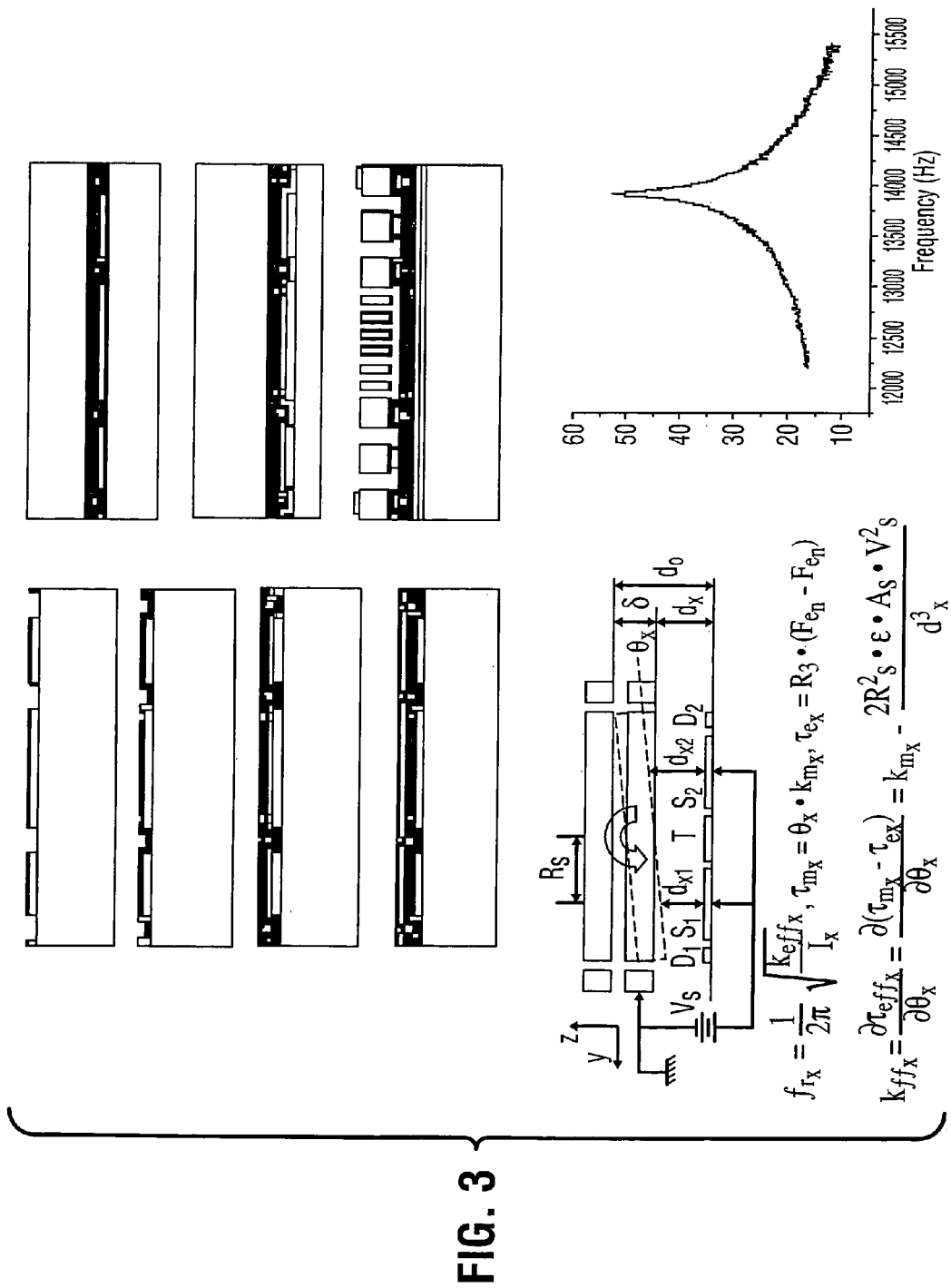
FIG. 3 shows a MEMS based resonant accelerometer fabricated by double CMP and double anodic bonding technology (Samsung Corporation)
Figure 4:
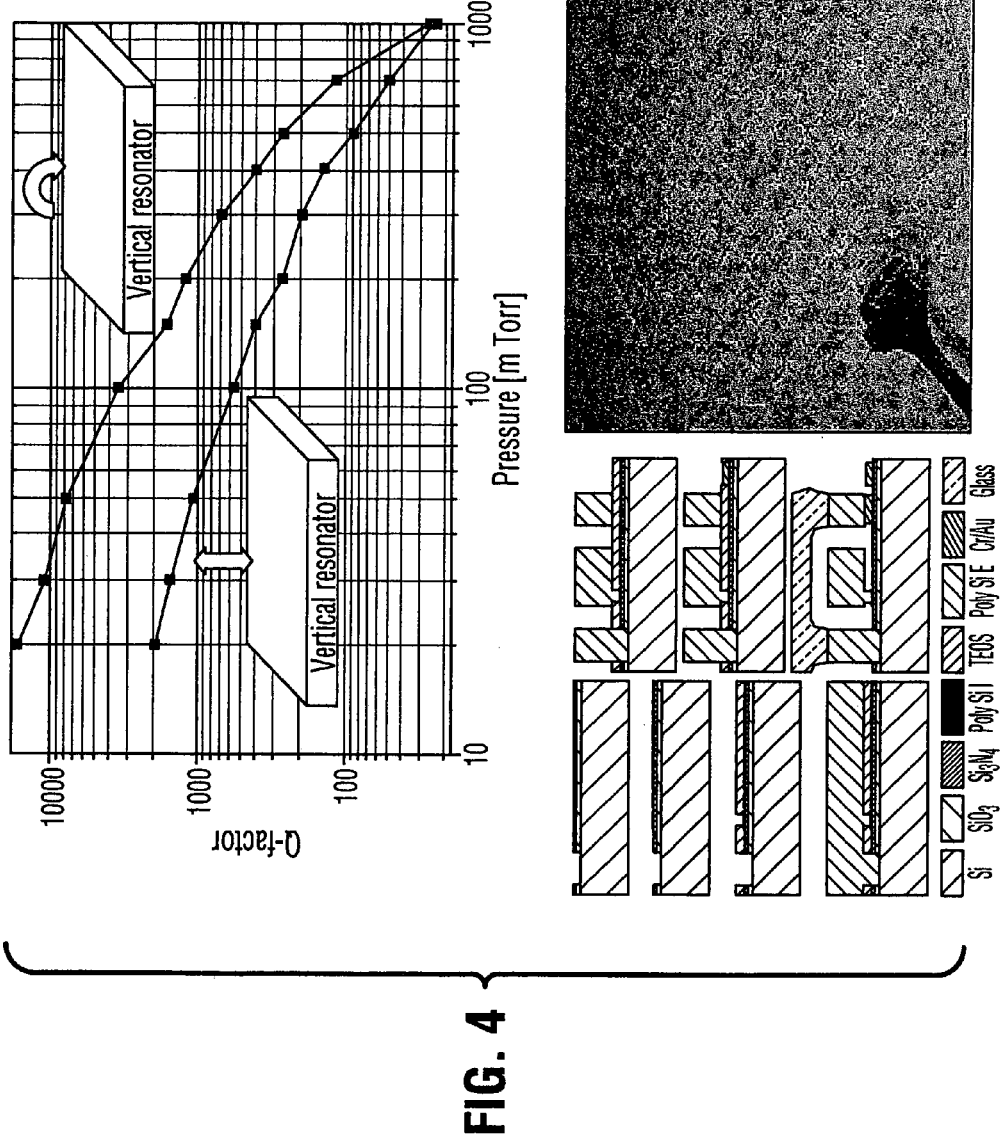
FIG. 4 shows the effect of residual vacuum on the performance of a vacuum sealed MEMS based resonant accelerometer fabricated by the anodic bonding of two substrates
Figure 5:
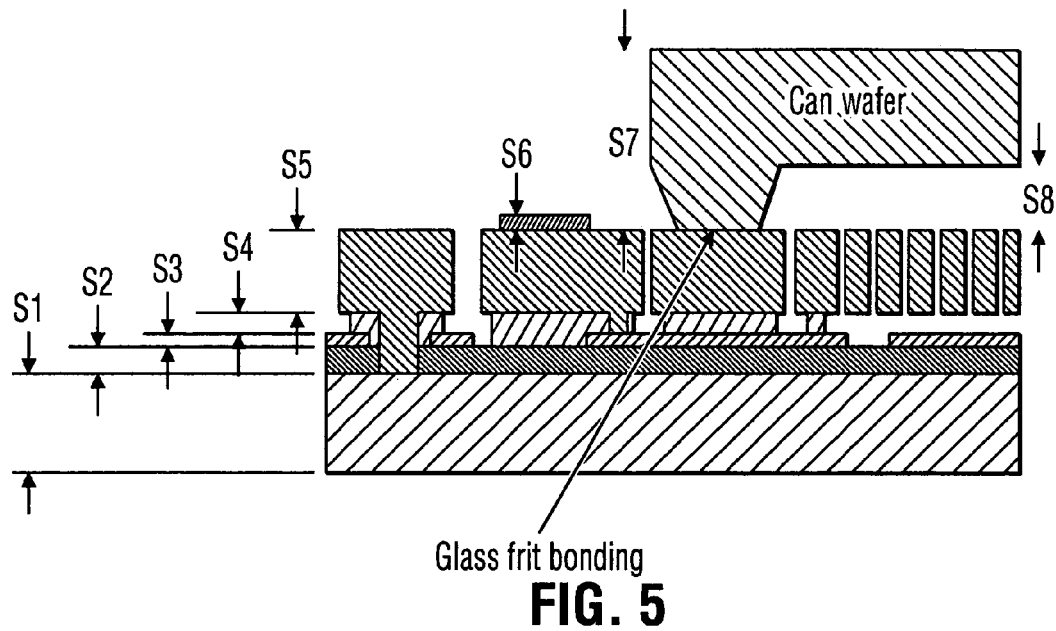
FIG. 5 shows a Robert Bosch surface micromachining profile.
Figure 6:
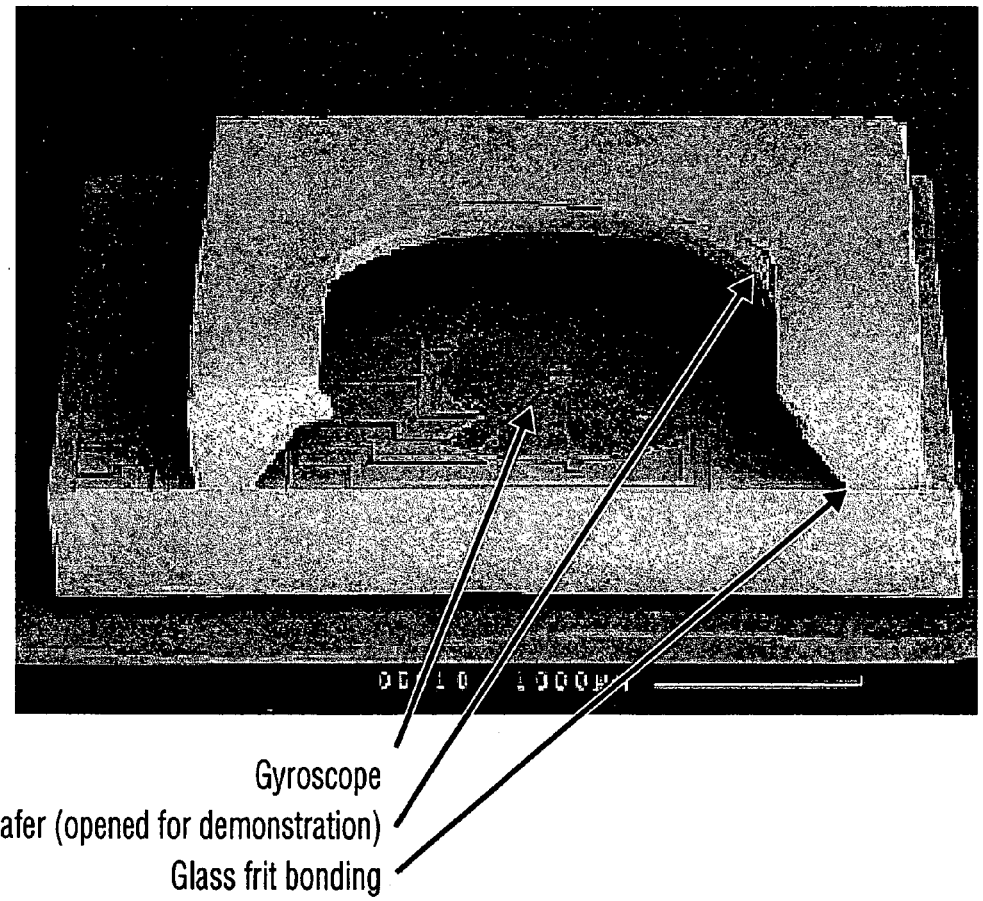
FIG. 6 shows a cap wafer glass frit bonded to the surface micromachined gyroscope produced at Robert Bosch GmbH.
Figure 7:
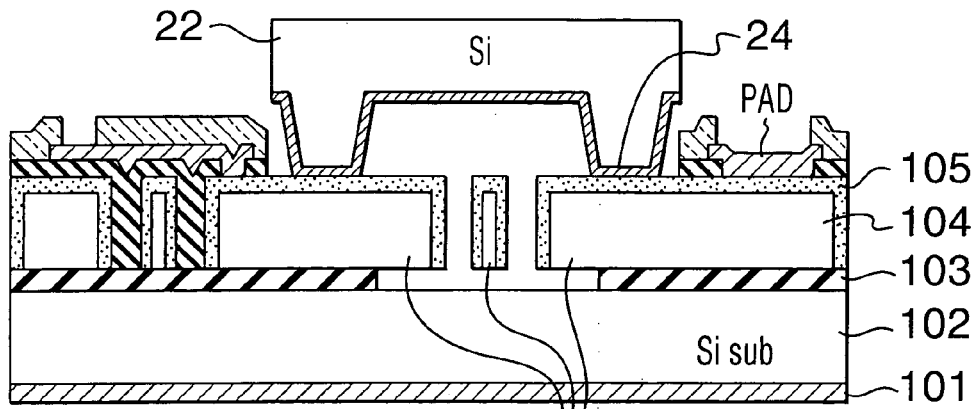
FIG. 7 shows the packaging of an acceleration sensor device via gold-silicon (SOI wafer) or gold-polysilicon eutectic bonding (U.S. Pat. No. 5,668,033)
Figure 8:
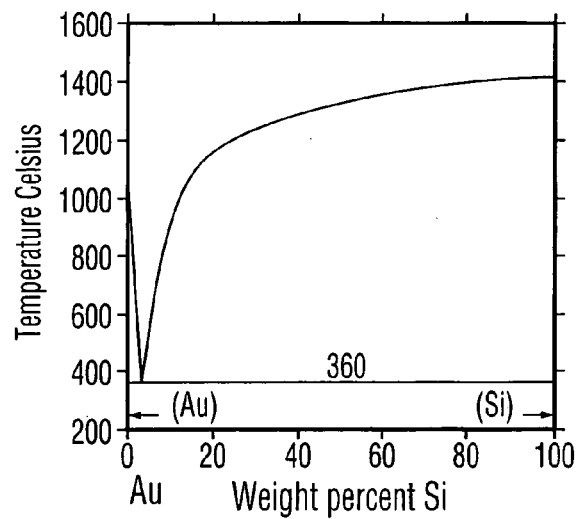
FIG. 8 is a Silicon—gold phase diagram showing a Si—Au eutectic temperature of 360° C.
Figure 9:
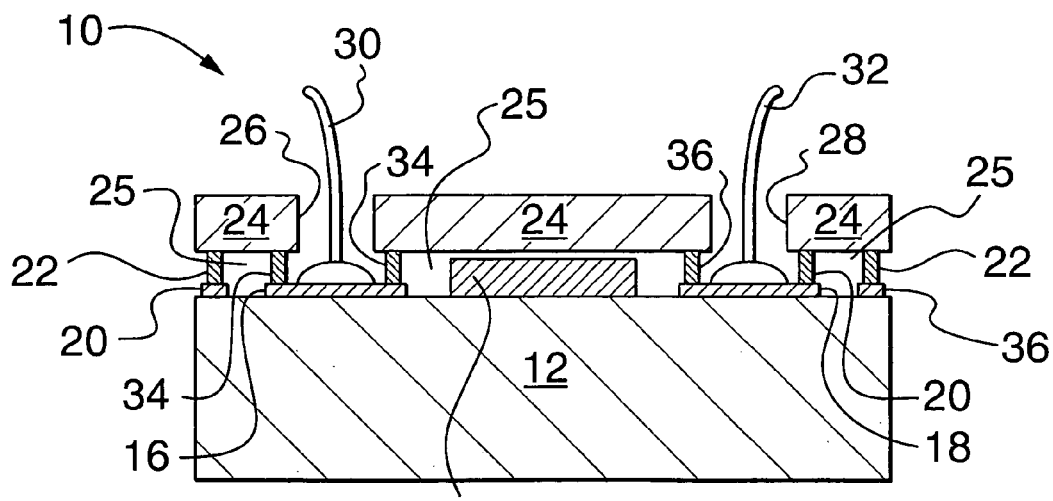
FIG. 9 shows the packaging of a micro-device using cold welding of a matching cap wafer having bonding cap gaskets located at the periphery of the bonding pads of the micro-device (U.S. Pat. No. 6,265,246.
Figure 10A:
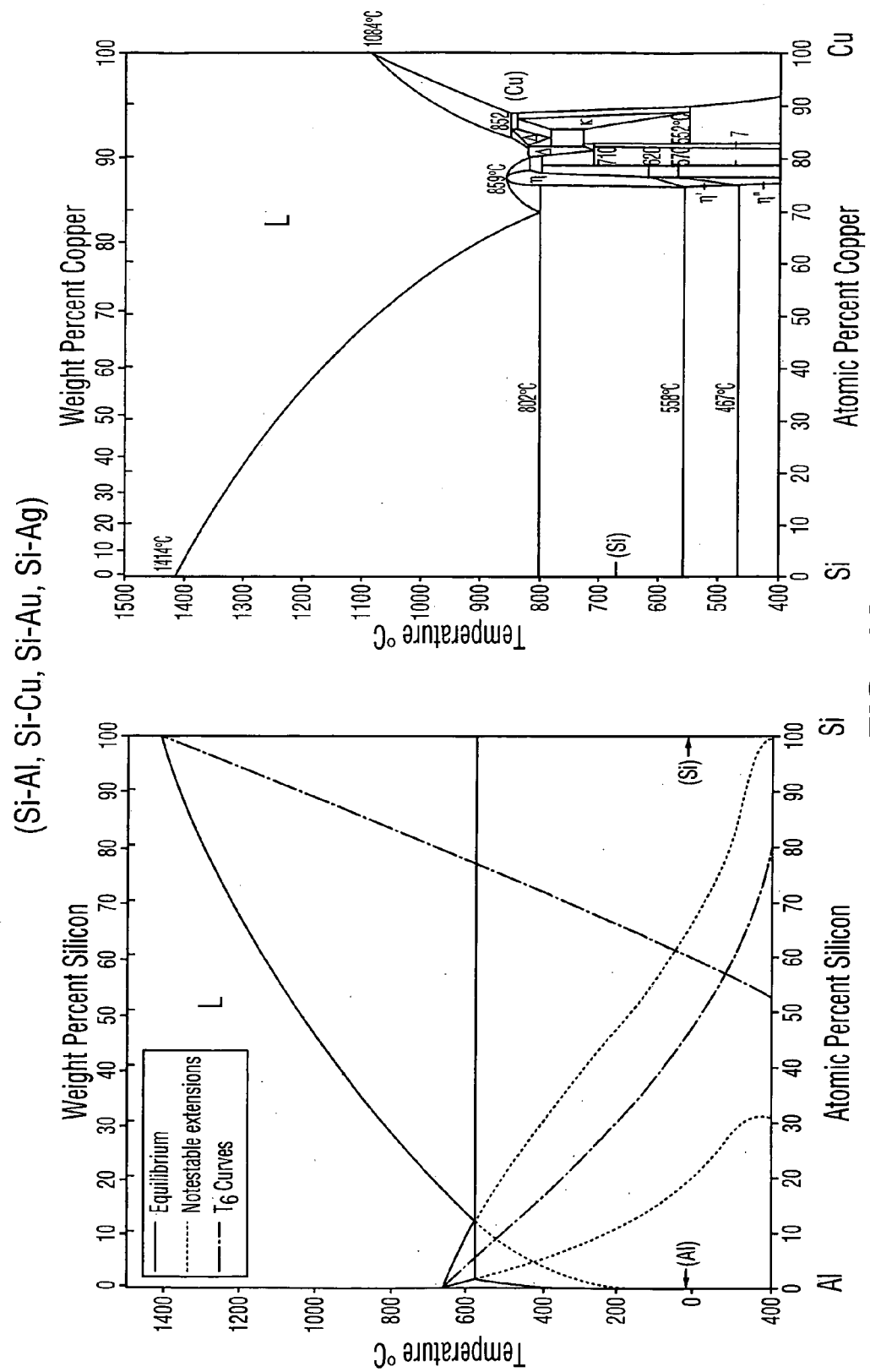
FIG. 10 shows phase phase diagrams of the four binary silicon combinations disclosed in Agilent's U.S. Pat. No. 6,265,246 (Si—Al, Si—Cu, Si—Au, Si—Ag)
Figure 12:
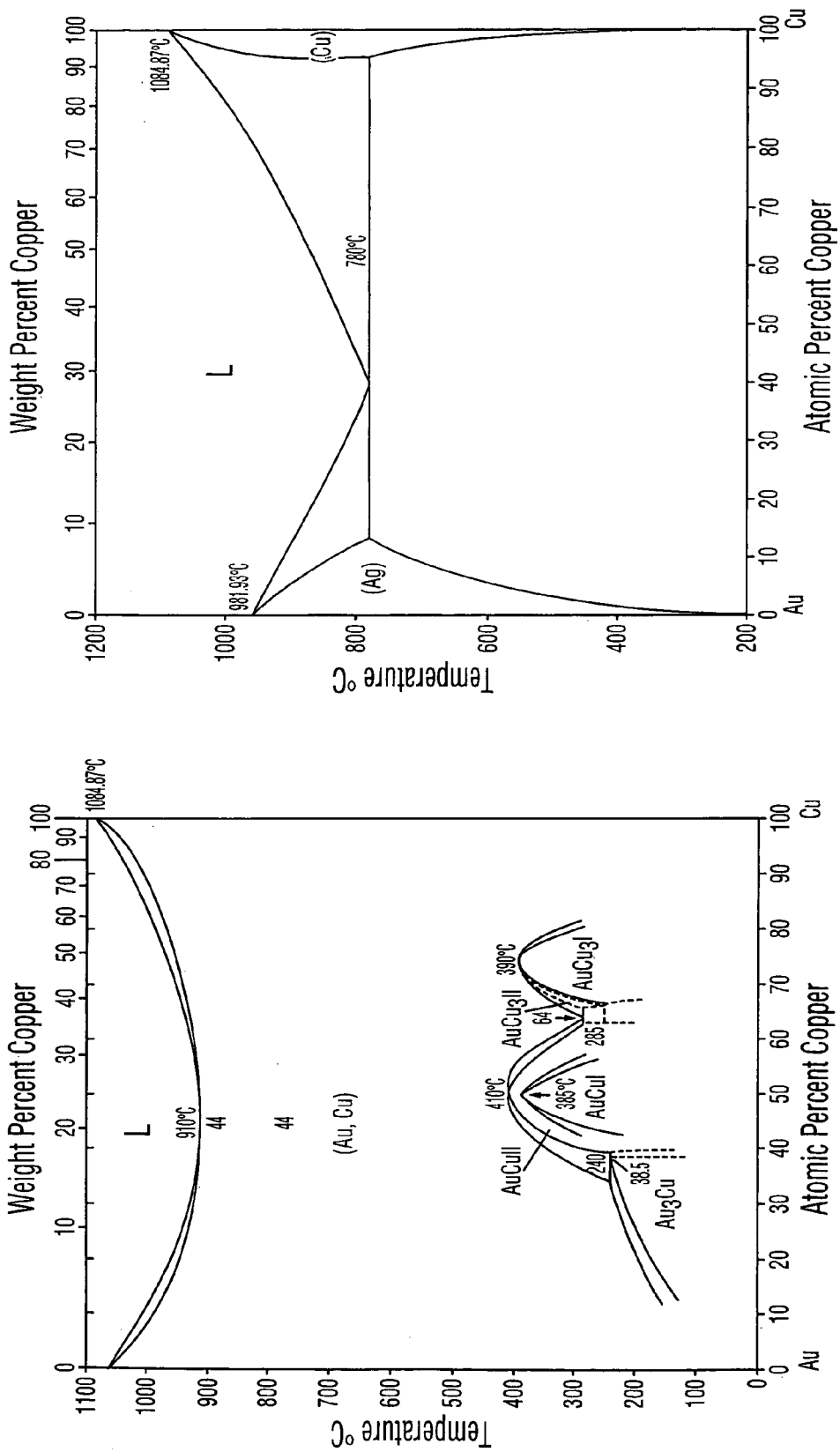
FIG. 12 shows the phase diagrams of the two other binary copper combinations disclosed in Agilent's U.S. Pat. No. 6,265,246 (Cu—Au, Cu—Ag)
Figure 13:
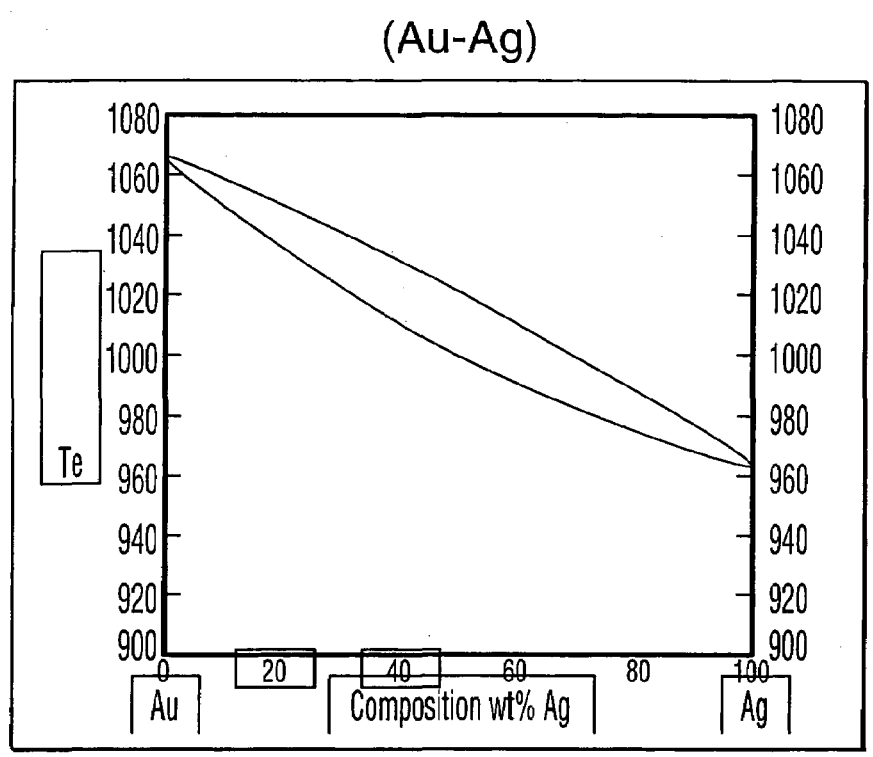
FIG. 13 shows the phase diagrams of the remaining binary gold combination disclosed in Agilent's U.S. Pat. No. 65,246 (Au—Ag)
Figure 14:
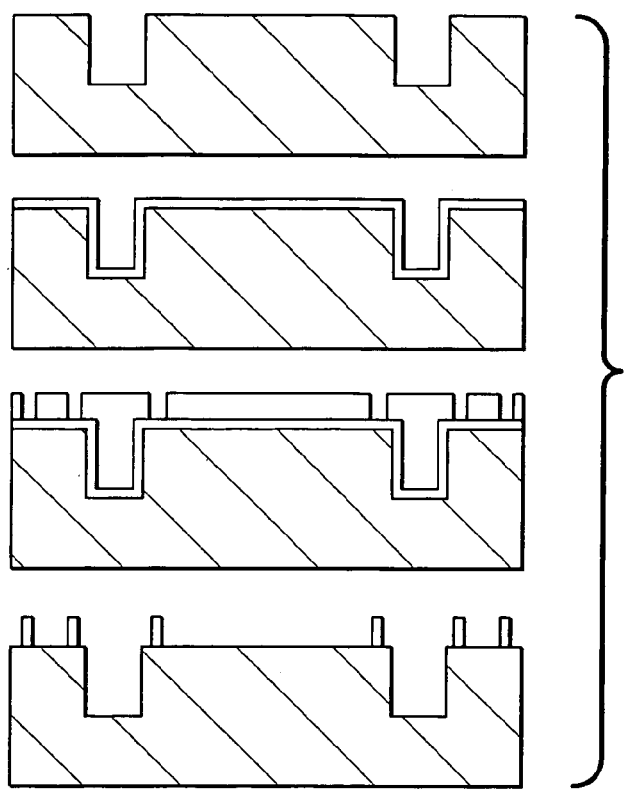
FIG. 14 shows the fbrication steps of the matching cap wafer having bonding cap gaskets of U.S. Pat. No. 6,265, 246.
Figure 15:
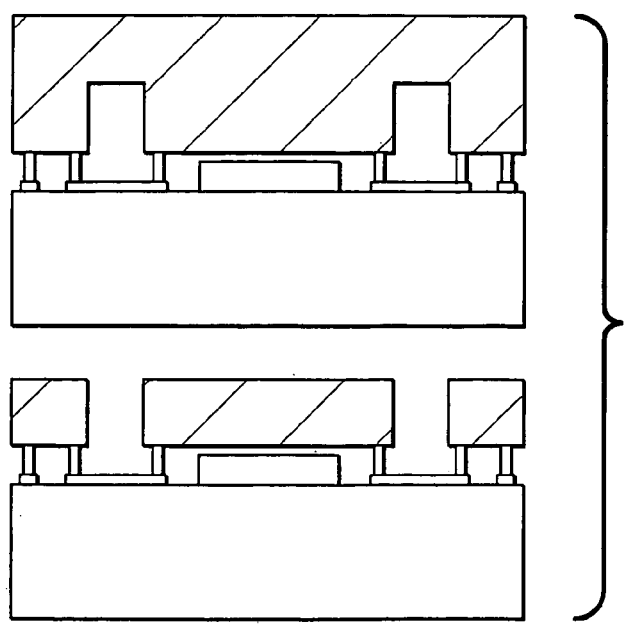
FIG. 15 shows the fabrication steps of the matching cap wafer having bonding cap gaskets of U.S. Pat. No. 6,265, 246.
Figure 16:
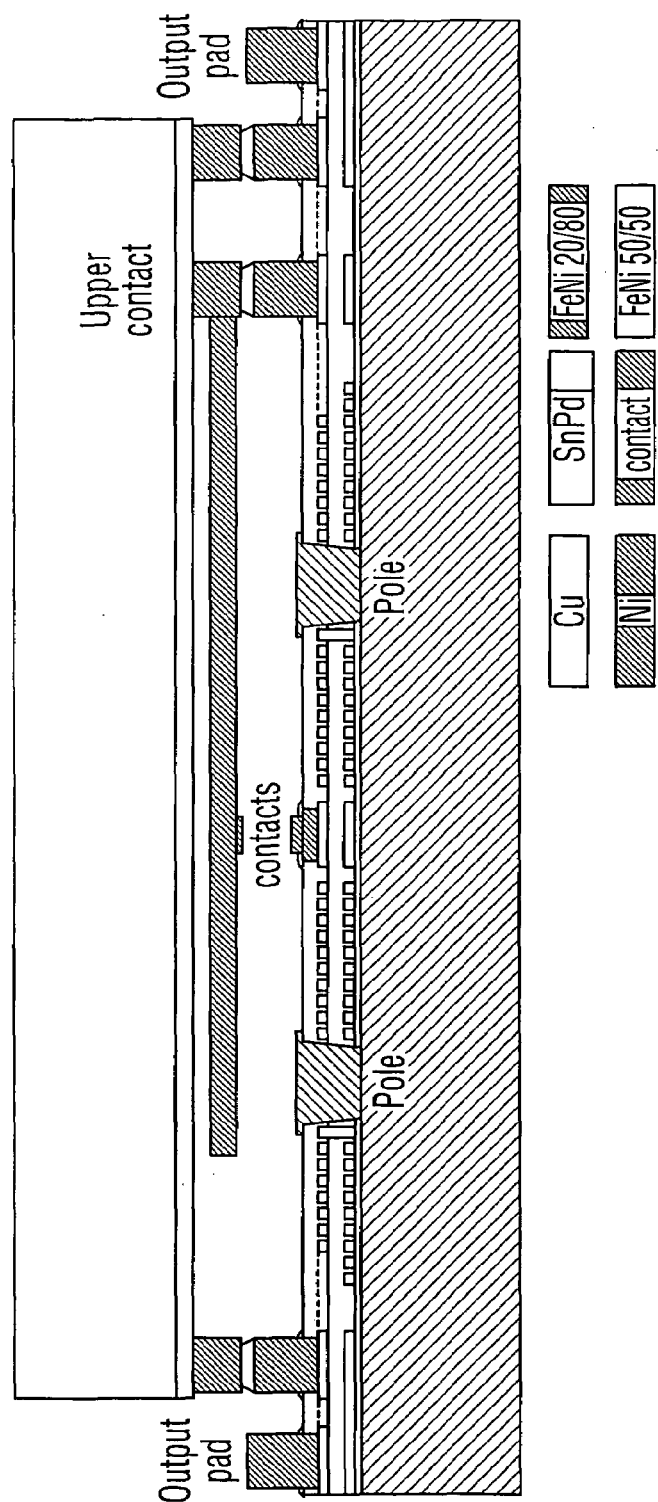
FIG. 16 shows the formation of a microstructure having an internal cavity (U.S. Pat. No. 6,297,072)
Figure 17:
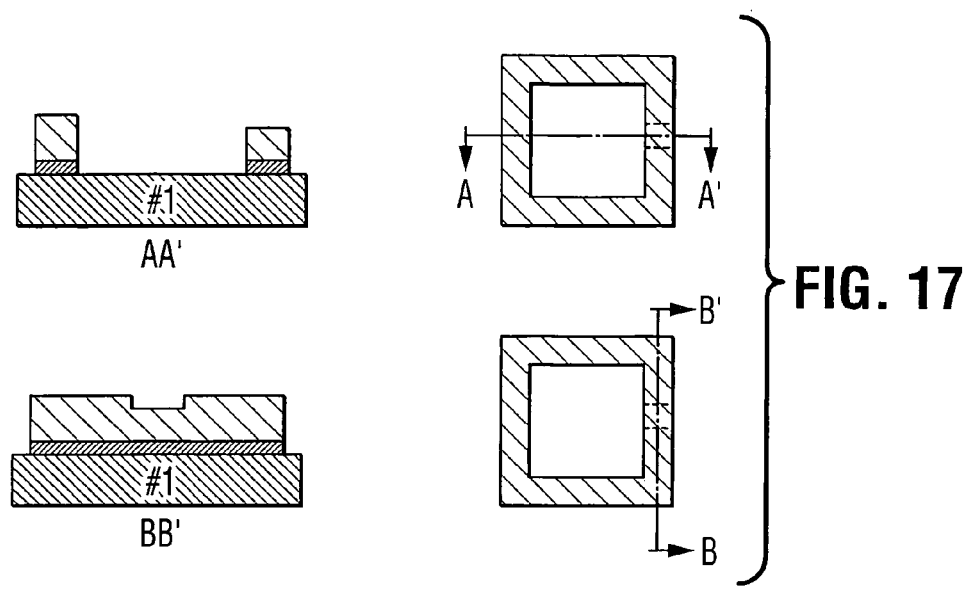
FIG. 17 shows the formation of the first chip of the first substrate of the microstructure having an internal cavity (U.S. Pat. No. 6,297,072)
Figure 18:
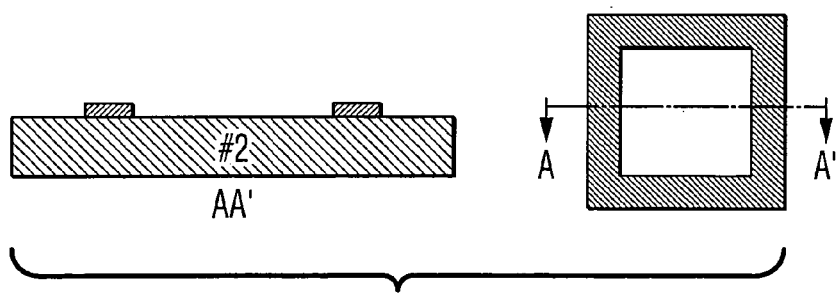
FIG. 18 shows the formation of the second chip of the second substrate of the microstructure having an internal cavity (U.S. Pat. No. 6,297,072)
Figure 19:
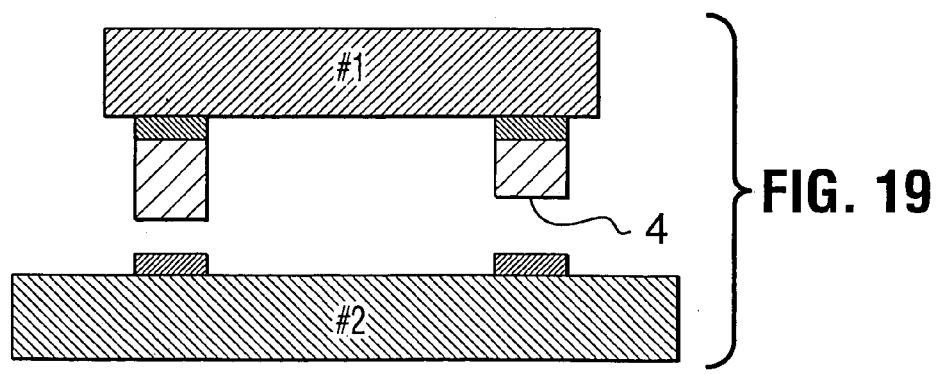
FIG. 19 shows the pre-treatment "flip-chip" alignment of the microstructure having an internal cavity (U.S. Pat. No. 6,297,072)
Figure 20:
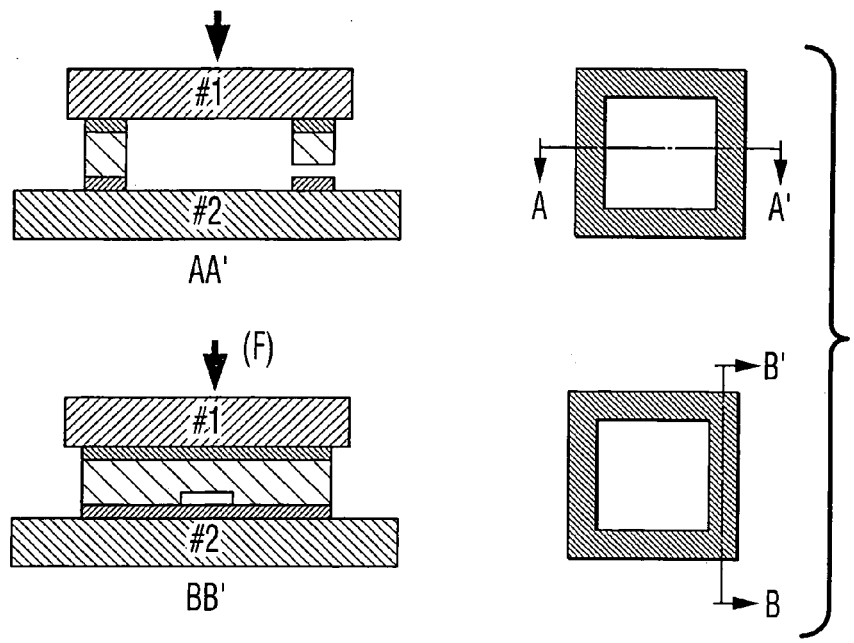
FIG. 20 shows the pre-bonding of the microstructure having an internal cavity (U.S. Pat. No. 6,297,072)
Figure 21:
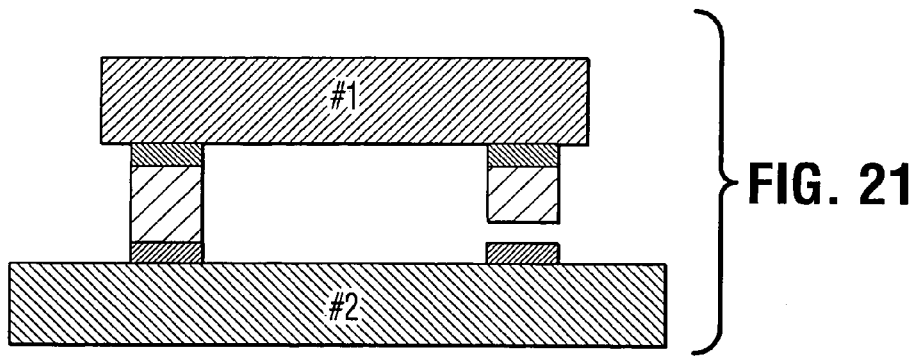
FIG. 21 shows the pumping and filling of the cavity of the microstructure having an internal cavity (U.S. Pat. No. 6,297,072)
Figure 22:
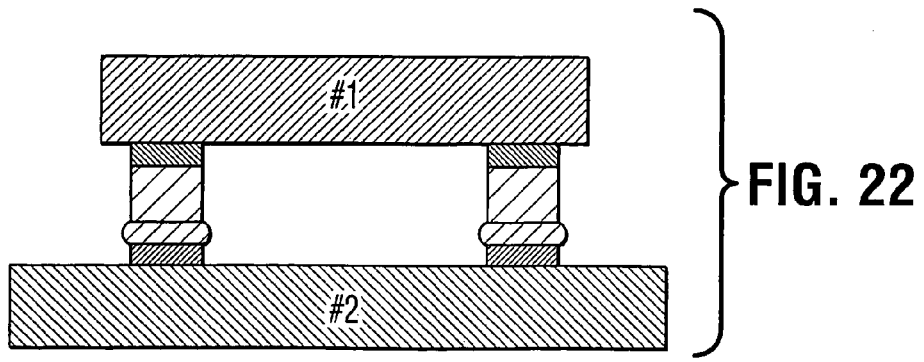
FIG. 22 shows the reflow and sealing of the cavity of the microstructure having an internal cavity (U.S. Pat. No. 6,297,072)
Figure 23:
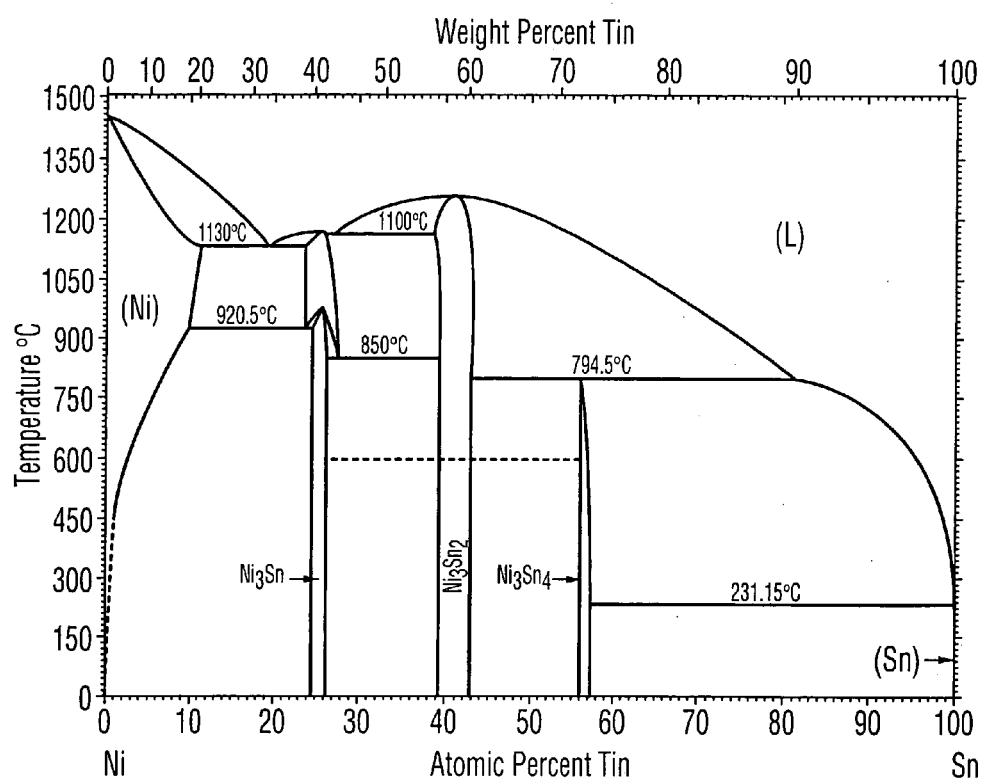
FIG. 23 is a tin-nickel phase diagram.
Figure 24A:
FIG. 24 is an example of a two polysilicon surface micromachining process flow used to fabricate the base wafer of MEMS devices which mechanical components are yet to be released by vapor HF.
Figure 24B:
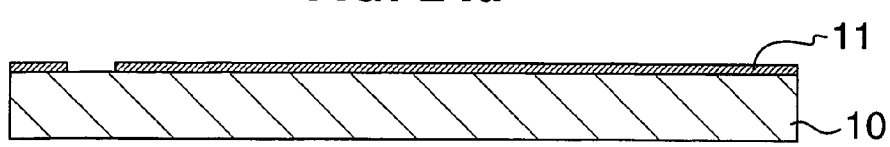
Figure 24C:
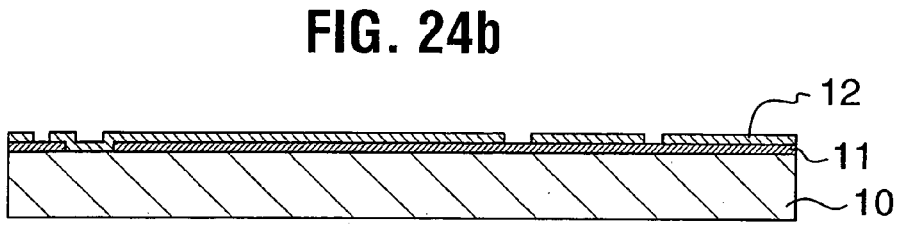
Figure 24D:
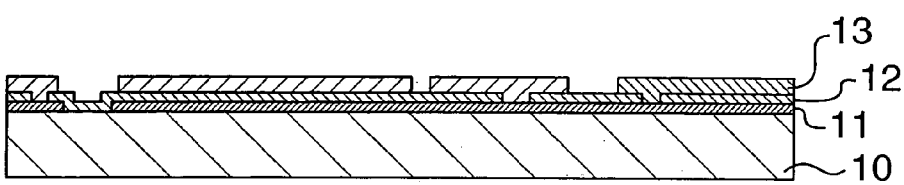
Figure 24E:
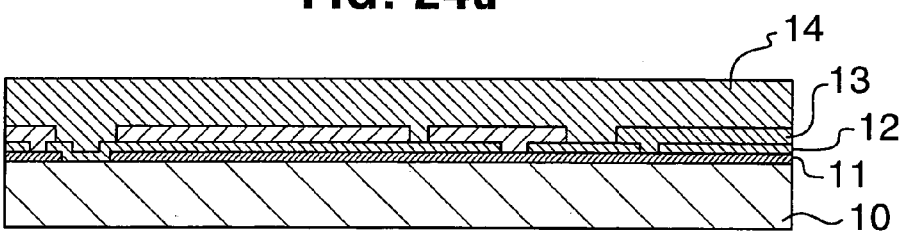
Figure 24F:
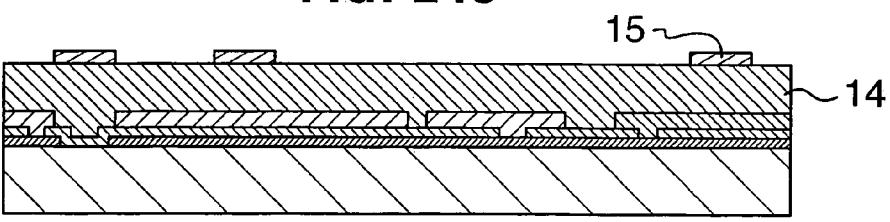
Figure 24G:
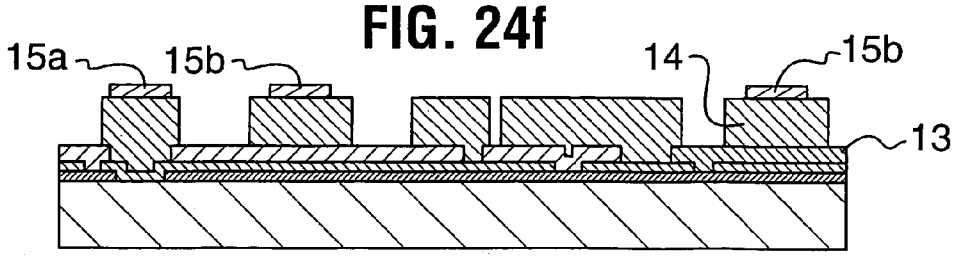

The description of the base wafer fabrication process, of the cap wafer fabrication process, of the bonding process and of the cap wafer machining following its bonding to the base wafer bonding will now be clearly described:

Description of the Fabrication Process of the Base Wafer

FIG. 24 shows an example of a two polysilicon surface micromachining process used to fabricate the base wafer of MEMS devices whose mechanical components are to be released by vapor HF (hydrofluoric acid).

The process starts with a silicon wafer 10 at step a. An oxide layer 11 is grown on the wafer 10, and this is patterned (step b). A first polysilicon layer 12 is deposited on the oxide layer 11 and patterned (step c). Next a sacrificial oxide layer 13 is deposited and patterned (step d). This step is followed by deposition of a second polysilicon 14 and stress relief (step e).

At step f, a metal-based interconnect layer 15 is applied and patterned. At step g, a deep reactive ion etch is carried out to form cavities 16 in the layer 14 extending down to the sacrificial oxide layer 13.

Metal layer 15 forms a bond pad 15a located outside the area to be sealed and an interconnect ring 15b that forms the basis of a metal-based sealing ring. Remaining segments 14a, 14b of the second polysilicon layer 14 form the mechanical components that are to be sealed inside the wafer-level package and which are subsequently released with HF, which etches away the sacrificial layer 13.

The result of this surface micromachining process produces a series MEMS devices distributed on the surface of the base wafer and incorporating mechanical components yet to be released by vapor HF. The structure of the MEMS device is not critical to the invention. It will be understood by one skilled in the art that many other types of structure can be made.

The optional process sequence of integrating optional sensing, control or communication devices and optional high-voltage actuation drivers Is not shown in FIG. 24.

Figure 25:
FIG. 25 is an example of a bond pad located outside the region to be sealed (observed after vapor HF removal of some sacrificial oxide.

The three main components of interest at this point of the fabrication of the base wafer are at least one bond pad 15a, which is located outside the device's area to be sealed in the wafer-level package and electrically connected to components inside the device's area to be sealed in the wafer-level package using an electrical connection made using one of the polysilicon layers below the top polysilicon layer (This connection is not shown in FIG. 24). This bond pad 15a is used to electrically connect the MEMS device to the outside world. This pad is typically made of an aluminum alloy, of copper or of gold. An example of such bond pad is shown in FIG. 25.

The novel metal-based interconnect ring 15b, which is to become the basis of the novel metal-based sealing ring, is patterned simultaneously with the bond pad 15a and could be made of an aluminum alloy of copper or gold. Aluminum alloy and copper are not suitable materials to be exposed to vapor HF. Gold is a suitable material to be exposed to vapor HF. Unfortunately, since gold cannot be used in a CMOS fabrication section due to contamination problems, it would be unusual to have a gold-based interconnect ring because it would mean that a lot of CMOS fabrication equipment (deposition equipment, photoresist coat equipment, photoresist exposure equipment, photoresist develop equipment, etch equipment, photoresist strip equipment and surface cleaning equipment and others) would become contaminated with gold. The preferred metals for the metal-based interconnect ring are aluminum alloy and copper. In the case of integrated optional sensing, control or communication devices and optional high-voltage actuation drivers, this metal-based interconnect ring may also be one of the interconnect layers of these devices or drivers. However, since aluminum alloy or copper are not suitable metals to be exposed to vapor HF, further processing is required before exposure to vapor HF.

Figure 26:
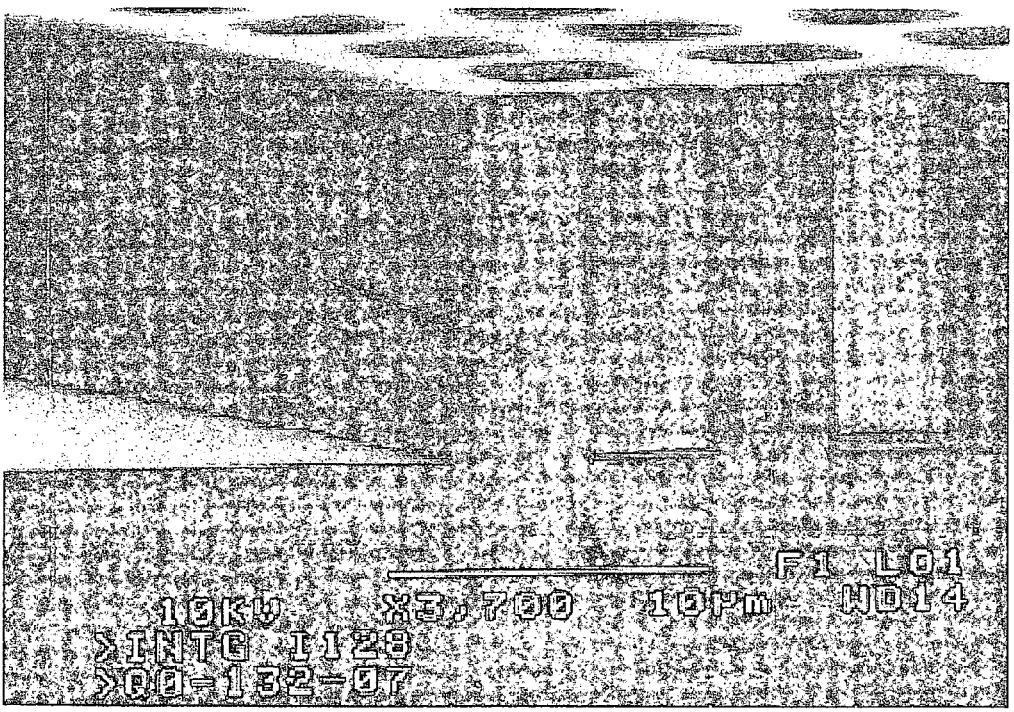
FIG. 26 is an example of mechanical components located inside the device's area to be sealed in the wafer-level package and providing substantial topology (To be released by removing underlying sacrificial oxide with vapor HF)

The mechanical components 14a, 14b located inside the region to be sealed in the wafer-level package and yet to be released with vapor HF are typically patterned using Deep Reactive Ion Etching (DRIE) and may provide significant topology because these mechanical components may be fabricated with thick polysilicon layer(s). An example of such high topology mechanical components obtained from a 10 μm thick polysilicon layer is shown in FIG. 26.

Figure 27:
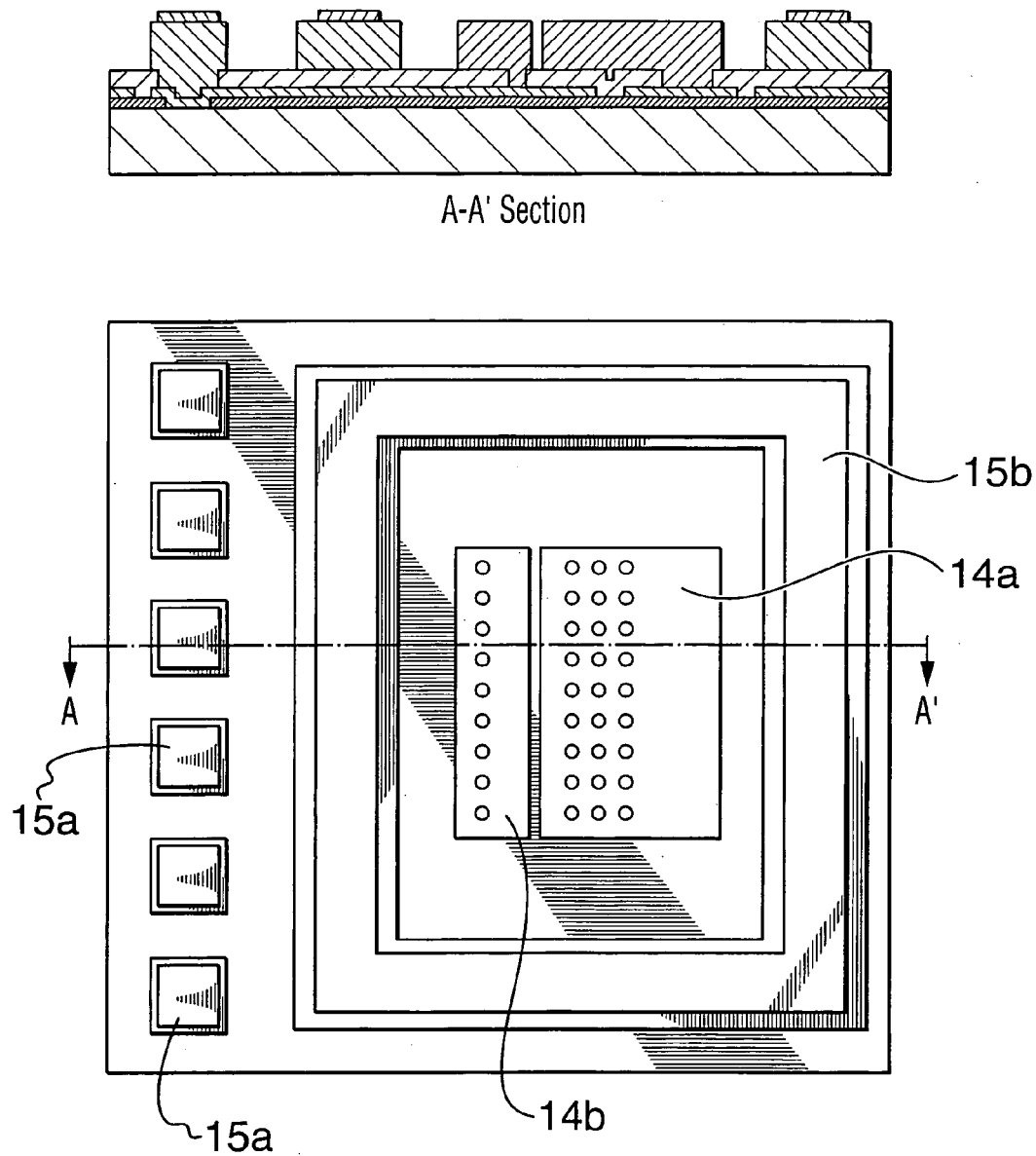
FIG. 27 is a top view of MEMS devices whose mechanical components are yet to be released by vapor HF.
Figure 28A:
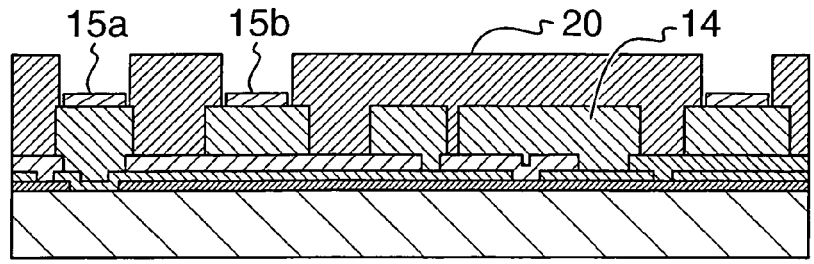
FIG. 28 illustrates the new process steps added to the surface micromachining process flow to prepare the base wafer for low temperature bonding.
Figure 28B:
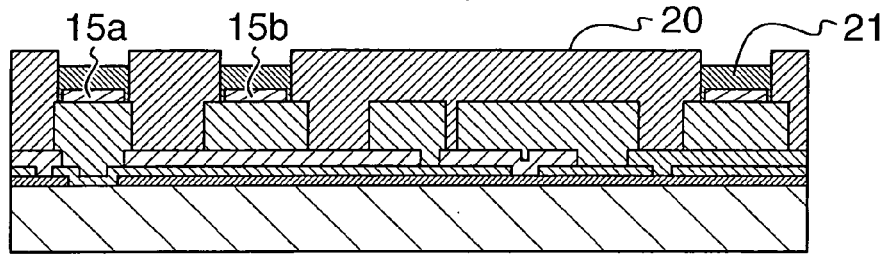
Figure 28C:
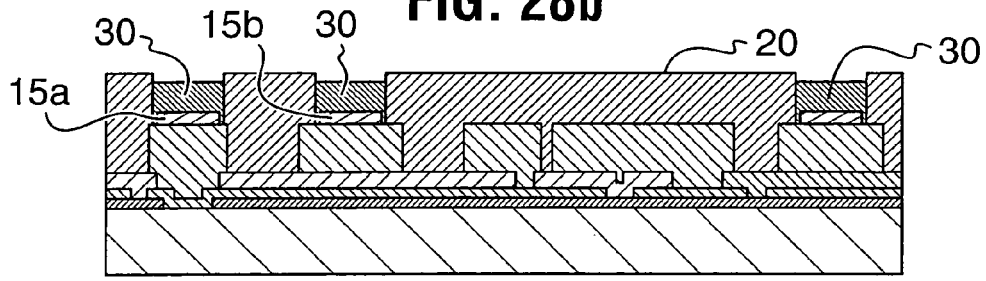
Figure 28D:
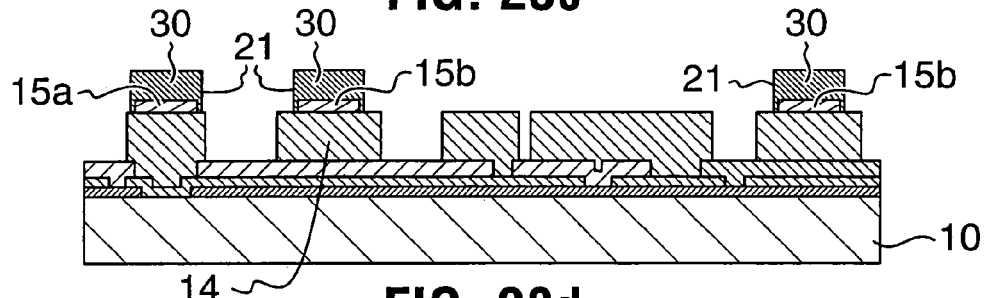
Figure 28E:
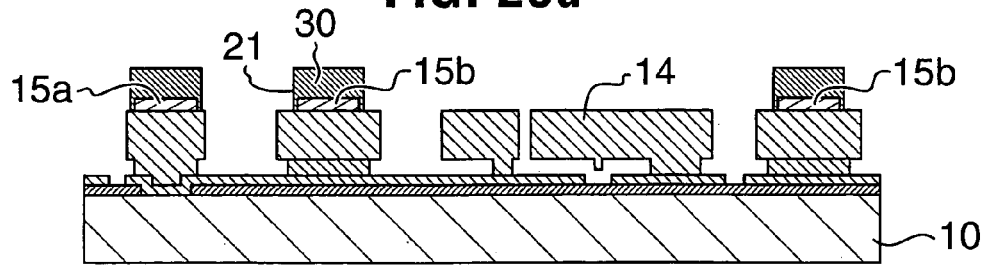

FIG. 27 shows the top view of a MEMS devices whose mechanical components are yet to be released by vapor HF. This top view also shows the three components of interest at this point of the fabrication of the base wafer, namely the bond pads located outside the device's area to be sealed in the wafer-level package; the novel metal-based interconnect ring 15b, which is to become the basis of the new metal-based sealing ring; and the mechanical components 14a, 14b located inside the device's area to be sealed in the wafer-level package and yet to be released with vapor HF. The mechanical components 14a, 14b are typically patterned using Deep Reactive Ion Etching (DRIE).

FIG. 28 shows the novel process steps added to the surface micromachining process flow of FIG. 24 to prepare the base wafer for low temperature bonding. Following the DRIE (Deep Reactive Ion Etch) of the top polysilicon layer 14, a protection photoresist layer 20 is coated, exposed and developed to expose the regions to be plated. These regions include the bond pads and the new metal-based interconnect ring. The photoresist thickness is adjusted to protect adequately the topology created from the DRIE of the polysilicon layer 14. The thicker the polysilicon, the thicker this protection photoresist. The temperature and duration of the post-develop bake of the photoresist are adjusted as to allow the photoresist to resist the subseqent cleaning and plating processes (step b). The photoresist layer 20 is exposed using a mask (not shown) which allows the bond pads 15a and the metal-based interconnect ring 15b to be opened over a wider area than their actual dimensions. The larger opening of the bond pads and of the metal-based interconnect ring permits the plating of the aluminum or copper sidewalls and protects the aluminum or copper during the subsequent vapor HF exposure.

EPA774-R-00-002 (March 2000), "Implementing cleaner printed wiring board technologies: Surface finishes", Design for the Environment Program, Economics, Exposure and Technology Division, Office of Pollution Prevention and Toxics, United States Environmental Protection Agency, Washington D.C., 20460, the contents of which are herein incorporated by reference, provides information about an improved fabrication process for technologies such as: printed circuit boards, PCB, Surface Mount Technologies, SMT, flip-chip and Ball Grid Arrays, BGA.

The technique described in this document can be applied to the wafer-level packaging of MEMS devices following proper cleaning of the aluminum (copper) surface, following proper aluminum (copper) de-oxydation using, for example, a diluted nitric acid to prepare the aluminum (copper) surface of the complete batch of twenty-four wafers for the application of a the zinc (palladium) catalyst, and following a light sulfuric or hydrofluoric acid dip to remove the catalyst from all non-aluminum (non-copper) exposed surfaces. The autocatalytic electroless plating of a 1.0 to 3.0 μm thick nickel barrier layer 21 (step b) is performed in the exposed catalyzed regions on this complete batch of twenty-four wafers at a temperature of about 90° C. and at a rate of about 1 μm/hour using no electrical bias. Unlike electrolytic plating, this electroless plating technique allows the plating onto the exposed electrically floating aluminum (copper) electrodes without having to be concerned about electrical connections. This is an important feature because it avoids the use of an electrical seed layer which would be very difficult to completely remove (at a later time in the process) from the sidewalls of structures similar to the ones shown in FIG. 26 prior the vapor HF release of the structures.

Stapleton Tech's Micro 282SX is an example of sodium-free, potassium-free and lithium-free acidic chemistry which can prevent mobile ion contamination and allow the integration of optional sensing, control or communication devices and optional high-voltage actuation drivers. This example of mobile ion-free electrolytic nickel chemistry contains a source of nickel ions, a source of phosphorus and a dimethylamine borane reducing agent providing a vapor HF-resistant nickel-phosphorus diffusion barrier alloy protecting the underlying aluminum (copper) to react with the upper gold layer during bonding and during higher temperature exposures of the MEMS device in the field.

A very thin layer (0.15 to 0.25 µm) of 24 kt pure soft gold 30 is then deposited in the exposed regions on the complete batch of twenty-four wafers (step c) over the selective nickel layer using immersion plating at a temperature of about 90° C. and at a rate of about 2 µm/hour using no electrical bias. The minimum thickness of 0.15 µm is designed to prevent the diffusion of nickel through the gold layer and its accumulation on the gold bonding surface.

This mechanism has been reported by Z. Lai, J. Liu, "Effect of the microstructure of Ni/Au metallization on bondability of FR-4 substrate", The Swedish Institute of Production Engineering Research (IVF), S-413, 53 Molndal, Sweden in the context of nickel-gold metallization of glass fiber-reinforced epoxy. The contents of this paper are herein incorporated by reference.

Unlike electrolytic plating, this immersion plating technique allows gold to be selectively deposited onto the exposed electrically floating nickel plated electrodes without having to be concerned about biasing the electrodes. This feature is also important because it also avoids the use of a nickel or gold seed layer which would be very difficult to completely remove (at a later time in the process) from the sidewalls of structures similar to the ones shown in FIG. 26 and which would block the vapor HF release of the structures. This gold layer prevents the oxidation of nickel and provides a stable and repeatable surface composition to bond to. This alleviates the previously discussed problems related to the natural oxidation of the bonding surfaces of the base wafer. Cyanide-free sulfite-based chemistries, such as Stapleton Tech's Micro 294, or other sodium-free, potassium-free and lithium-free chemistries prevent mobile ion contamination and allow the integration of optional sensing, control or communication devices and optional high-voltage actuation drivers.

Following 24kt gold deposition, the protection photoresist is stripped using an oxygen plasma (step d). Because gold is a noble metal, this exposure to an oxygen plasma will not oxidize its surface. This stable gold surface situation contrasts with the process described in U.S. Pat. No. 5,668,033 (Nippon Denso Co., Ltd.) Prior Art which discloses the use of the oxygen-unstable silicon surface into a silicon-gold eutectic bonding process. The improved gold-exposed surface of the base wafer prevents natural re-oxidation and prevents oxygen plasma-induced oxidation of the bonding surface, thus eliminating restrictions concerning the impact of the time delay required between steps, during manipulation and while successively bonding all of the forty-eight wafers (one set of twenty-four cap wafers to bound to one set of twenty-four base wafers).

Following photoresist strip, the vapor HF mechanical release of the mechanical components located inside the area to be sealed in the wafer-level package can be performed (step e).

Figure 29:
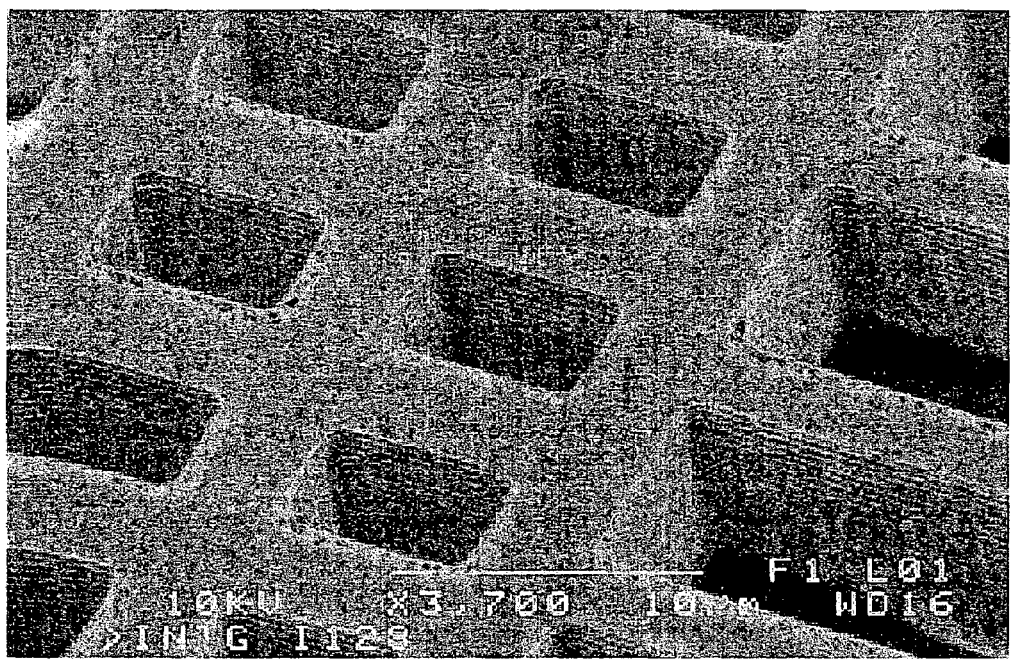
FIG. 29 is an example of a released structure whose sacrificial oxide has been completely removed using vapor HF.

FIG. 29 is an example of a released structure whose sacrificial oxide has been completely removed using vapor HF. Since immersion gold and electroless nickel are both inert in vapor HF, and since nickel overlaps the underlying aluminum bond pads and interconnect ring, the aluminum (or copper)—electroless nickel—immersion gold structure is not affected by a long exposure to vapor HF and the top bonding surface remain oxide-free, ready for a reliable bonding to the cap wafer.

The barrier layer 21 is optional. In addition to nickel, the barrier layer can be made of a material selected from the group consisting of: titanium, Ti, tantalum, Ta, platinum, Pt, rhodium, Rh, palladium, Pd, ruthenium, Ru, titanium tungsten, TiW, titanium tungsten nitride TiW(N), titanium nitride, TiN, titanium carbide, TiC, titanium boride, TiB, tungsten nitride, WN, tungsten carbide, WC, tungsten boride, WB, tantalum nitride, TaN, tantalum carbide, TaC, tantalum boride, TaB, halfmium nitride, HfN, halfmium carbide, HfC, halfmium boride, HfB, or tungsten silicon nitride, WsiN.

Additionally, a spacer layer can be optionally deposited under the barrier layer 21. The spacer layer can be made of a material selected from the group consisting of: gold, Au, nickel, Ni, nickel-phosphorus, Ni(P), nickel-palladium, Ni(Pd), chromium, Cr, copper, Cu, bismuth, Bi, cadmium, Cd or palladium-cobalt, PdCo.

The spacer layer is preferably deposited by electroless plating, but can also be deposited by auto-catalytic plating, electrolytic plating, electroplating method, evaporation, electron beam deposition, a lift-off technique, sputtering, chemical vapor deposition (CVD), plasma enhanced chemical vapor deposition (PECVD) or metallorganic chemical vapor deposition (MOCVD).

Description of the Fabrication Process of the Cap Wafer

Figure 30A:
FIG. 30a shows the process steps required to prepare the cap wafer for low temperature bonding.
Figure 30B:
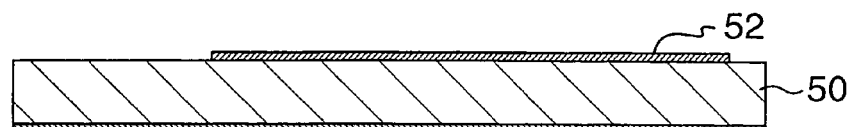
Figure 30C:
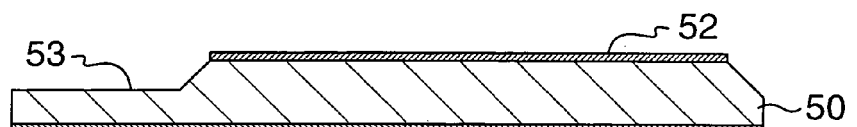
Figure 30D:
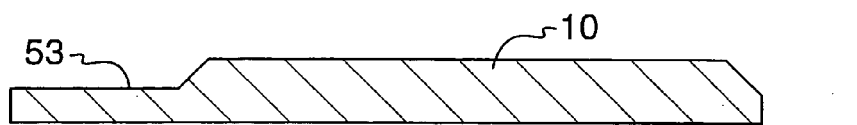
Figure 30E:
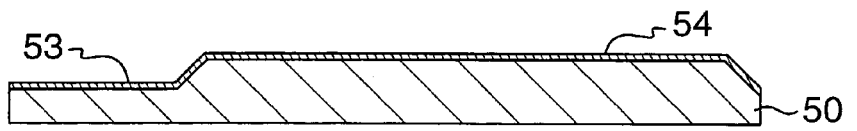
Figure 30F:
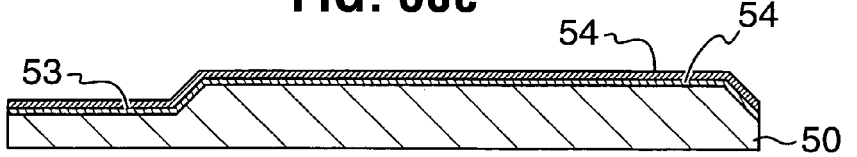
Figure 30G:
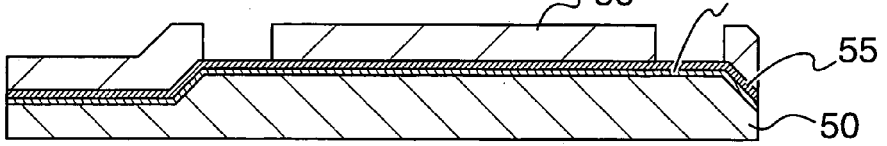
Figure 30H:
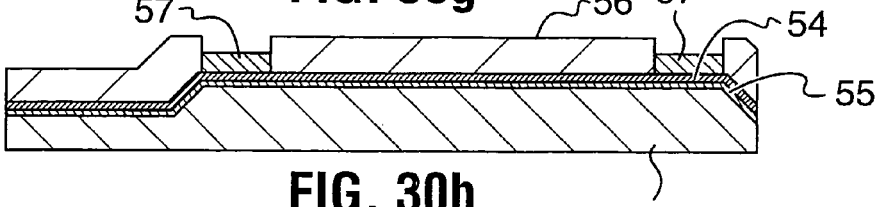
Figure 30I:
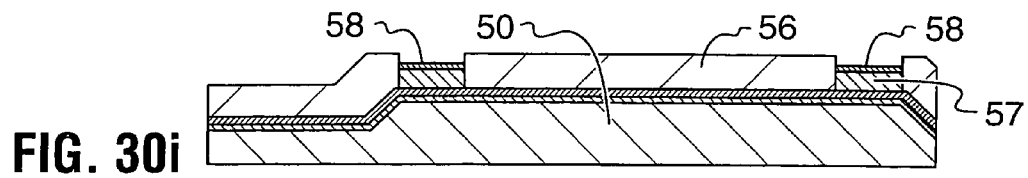
Figure 30J:
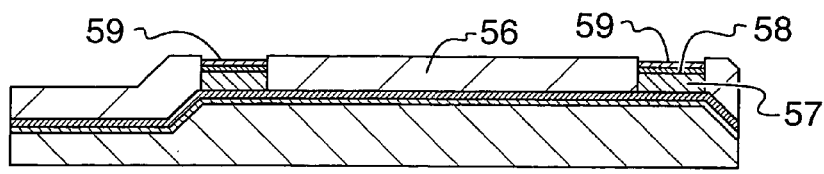
Figure 30K:
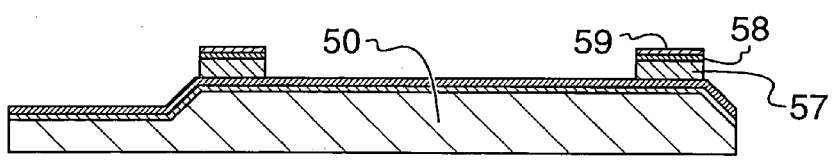
Figure 30L:
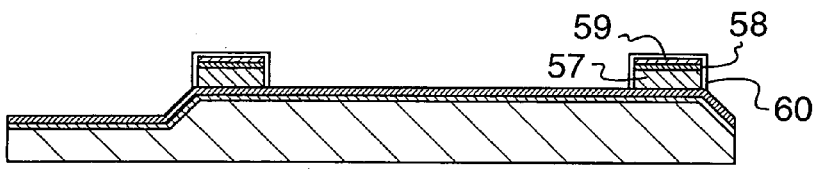
Figure 30M:
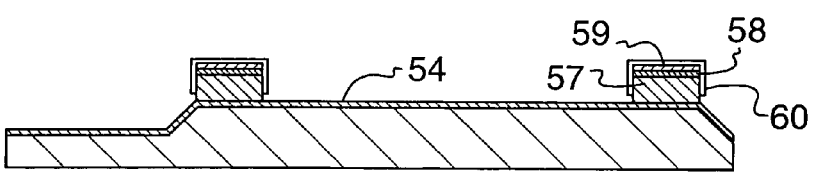
Figure 30N:
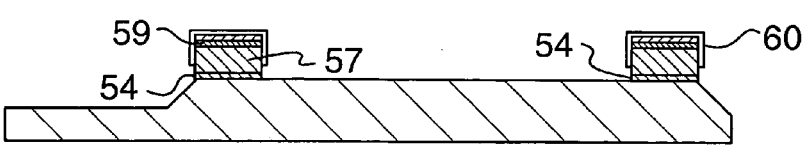
Figure 30O:
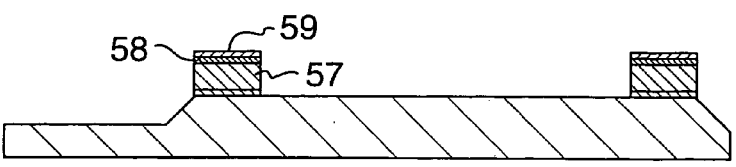
Figure 30P:
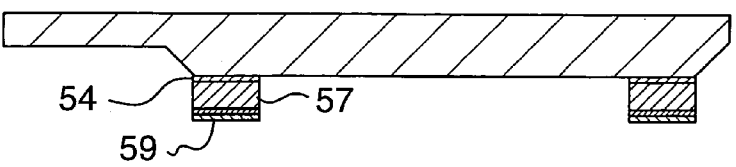

FIGS. 30a and 30b illustrate the fabrication process of the cap wafer. First, at step a, a flat, 300 to 675 µm thick, high resistivity silicon wafer 50 of low enough carrier concentration to be transparent in the C-Band (1300 nm), L-Band (1550 nm) and L-Band (1625 nm) infrared optical telecommunication bands is thermally oxidized on both faces to generate a 0.1 to 1.0 µm thick oxide hard mask 51, 52 for the subsequent silicon machining.

Standard photolithography is performed to expose the silicon wafer 50 outside the region to be sealed with the wafer-level packaging (step b).

A deep machining of the silicon is performed to achieve a silicon thickness about half of the original silicon thickness over a portion 53 of the wafer outside the region to be sealed with the wafer-level packaging. Dry DRIE or wet KOH or TMAH can be used. If wet KOH and TMAH is used, special precautions should be taken as to take into account the type of silicon wafer, its crystal orientation and the alignment of the mask openings to the actual crystal lattice to achieve the desired final width at the desired final etched thickness.

A removal of the thermal oxide hard mask is performed using a wet HF solution as to leave a clean, residue-free silicon surface (step d).

A 0.05 to 1.0 µm thick sodium-free, potassium-free and lithium-free barrier metal 54 is deposited (step e). This barrier metal prevents the formation of intermetallic compounds by limiting the interaction of the underlying silicon wafer with the overlying seed layer and plated layers during the bonding process and during high temperature operation of the MEMS device in the field. Examples of such barrier metals include titanium, Ti, titanium-tungsten, TiW, nickel, Ni, chromium, Cr, titanium nitride, TiN, alloys of these, compound structures of these, or other barrier metals known to limit the reactivity of gold to silicon;

A 0.05 to 1.0 μm thick sodium-free, potassium-free and lithium-free seed layer 55 is deposited (step f), preferably in-situ on the previously deposited barrier metal. This barrier metal allows the subsequent electrolytic plating to be easily performed in windows to be opened through the following plating mask. This seed layer 55 should be selected to prevent the natural oxidation of its surface. Examples of such seed layers involve gold, Au, nickel/gold structures, Ni/Au, platinum, Pt, rhodium, Rh, alloys of these, compound structures of these, or other noble metals known to be resistant to oxidation.

A 1.0 to 100.0 μm thick plating mask 56 is coated, exposed and developed to open windows to be plated with the following metals, using electrolytic plating. Unlike autocatalytic electroless plating and immersion plating, the electrolytic plating requires this seed layer to be exposed at the bottom of each window to be electrically connected so as to initiate and maintain the plating process.

The mask pattern on this cap wafer should be the mirror image of the mask pattern of the sealing metal ring of the base wafer. It should be noted at this point that the regions symmetrical to the bond pads of the base wafers are not to be opened through this plating mask, and thus not to be plated on the cap wafer. Typical plating masks are high quality photoresists and polymers such as one known under the trade designation SU-8, available from MicroChem Inc, of Newton, Mass. The required thickness to be plated is dependant upon the nature of the underlying MEMS mechanism to protect and is basically only limited by the thickness of the plating mask;

A 1.0 to 75.0 μm thick electrolytic nickel layer 57 is plated from sodium-free, potassium-free and lithium-free nickel sulfamate, $Ni(NH_2SO_3)_2$, nickel chloride, $NiCl_2.6H_2O$ and boric acid, $H_3BO_3$, or, alternately, nickel sulfate, $NiSO_4.6H_2O$, nickel chloride and boric acid over the seed layer 56 in the opened windows of the plating mask (step h). The electrolytic plating of nickel is performed at a temperature of 55° C., at a current density of about 70 mA/cm$^2$, at a nickel metal concentration of about 335 g/l, at an acid pH value of about 4.0, can produce a semi-bright electrolytic nickel plating at a rate of about 0.75 μm/minute. See, for example, G. Di Bari, "Nickel Plating", ASM Handbook, Vol 5, Surface Engineering, ASM International, Materials Park, Ohio 44073, 1994, p.201.

A very thin layer (0.15 to 0.25 μm) of 24 kt pure soft gold 58 is then deposited over the nickel layer 57 (step i) using electrolytic plating from sodium-free, potassium-free and lithium-free ammonium gold sulfite electrolyte, $(NH_4)_3[Au(SO_3)]$ at a temperature of about 55° C., at a current density of about 7.5 mA/cm$^2$, at a gold metal concentration of about 12 g/l, at a neutral pH value of 7.0 can produce a semi-bright electrolytic gold plating at a rate of about 0.45 μm/minute. The minimum thickness of 0.15 μm prevents the diffusion of nickel through the gold layer and its accumulation on the gold bonding surface.

A thin layer 59 of low temperature eutectic metal is deposited by electrolytic plating. Out of all metals used in this new bonding process, this low temperature eutectic metal is the one with the lowest melting temperature. The type of low temperature eutectic metal to be used and its composition will control the bonding temperature of the base wafer to the cap wafer.

Figure 31:
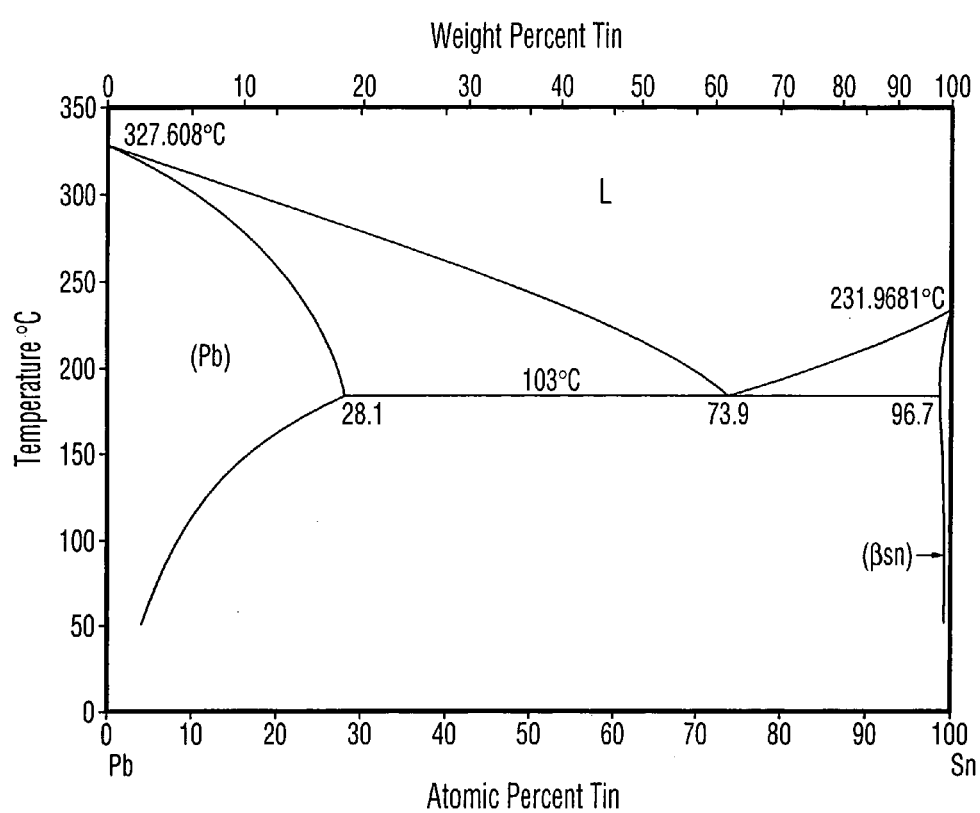
FIG. 31 is a lead-tin phase diagram showing a eutectic temperature of 183° C. for the 37.1% Pb-73.9% Sn eutectic alloy.

The most common low temperature eutectic metal is the lead-tin eutectic solder (37.1% Pb73.9% Sn). FIG. 31 shows the lead-tin phase diagram which indicates that an eutectic temperature as low as 183° C. is associated to the 37.1% Pb-73.9% Sn eutectic alloy. This low eutectic temperature of 183° C. is interesting. However, since there is much pressure to convert all manufacturing processes to lead-free processes, an alternate low temperature eutectic metal is preferably selected.

An analysis of various tin-based phase diagrams indicate that many low temperature tin-based eutectic metals have a low eutectic temperature of less than about 400° C.

FIG. 32 shows tin-based metals having an eutectic ° T of less then 400° C., namely Tin-Gold, with a 20% Sn-80% Au eutectic point @ 282° C.; Tin-Silver; with a 96.2% Sn-3.8% Ag eutectic point @ 221° C.; Tin-Aluminum, with a 97.6% Sn-2.4% Al eutectic point @ 228° C.; Tin-Copper, with a 98.7% Sn-1.3% Cu eutectic point @ 227° C.; Tin-Nickel, with a 99.9% Sn-0.1% Ni eutectic point @ 231° C.; and Tin-Silicon, with a 99.9% Sn-0.1% Si eutectic point @ 232° C.

Figure 33:
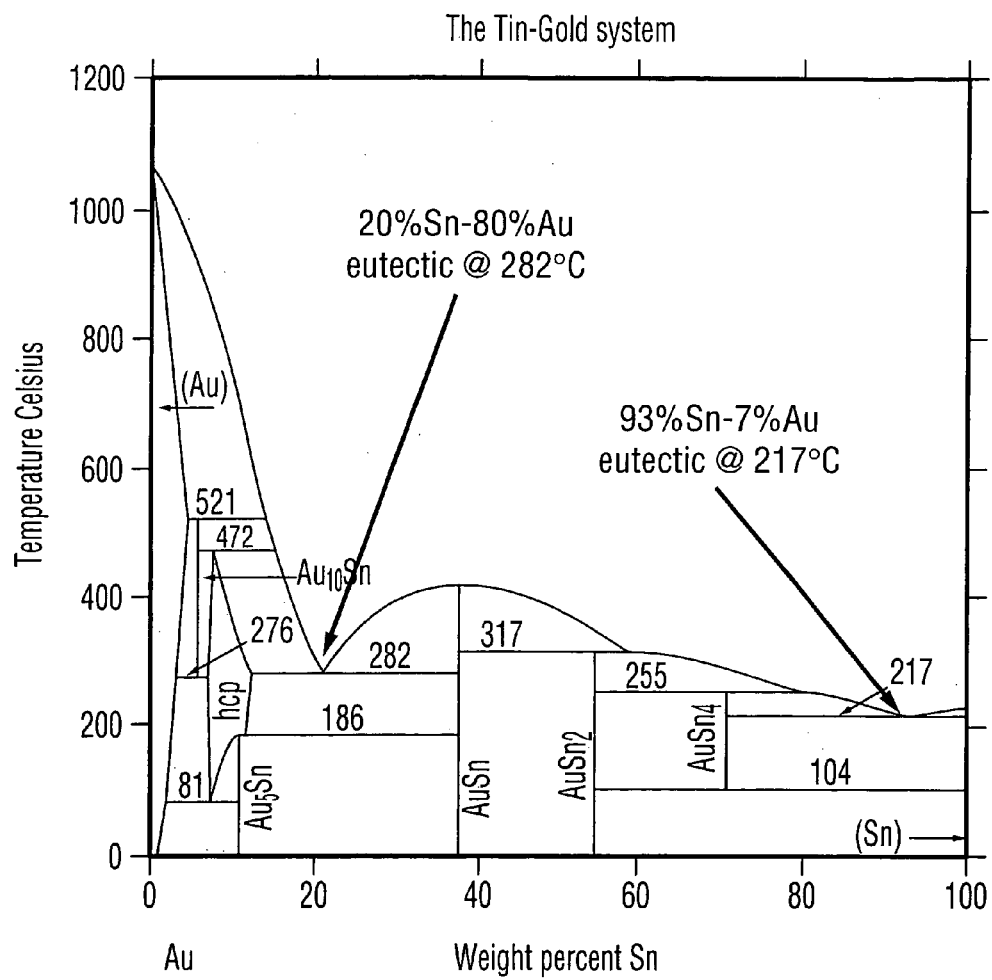
FIG. 33 is a diagram of a Tin-Gold system.

FIG. 33 shows that the Tin-Gold system is particularly interesting because the large proportion of gold in the 20% Sn-80% Au 282° C. eutectic composition and the large proportion of tin in the 93% Sn-7% Au 217° C. eutectic indicate that pressing a pure layer of gold against a pure layer of tin at a temperature much higher then 282° C. and cooling toward 282° C. will cause the inter-mixing of both metals at the tin-gold interface; result in the consumption of the interface by gold, thus resulting in the formation of a gold-rich alloy near the gold-side of the tin-gold interface; result in the consumption of the interface by tin, thus resulting in the formation of a tin-rich alloy near the tin-side of the tin-gold interface; and result in a diffusion bonding with a high strength bonding at the inter-mixed tin-gold interface.

The plating of a pure tin layer of optimized thickness (about 0.1 μm to completely consume the 0.2 μm of gold from the cap wafer and the 0.2 μm of gold from the base wafer and form a 20% Sn-80% Au eutectic) over the gold layer of the cap wafer will result in the formation of an excellent bond when this tin layer will be pressed at high temperature between the gold layer of the cap wafer and the gold layer of the base wafer. This is an important aspect of this invention: Once pressed between the base wafer and the cap wafer at high temperature and at a pressure of about 0.2–1.0 kg/mm$^2$ or 2–10N/mm$^2$, this pure tin layer allows the formation of the 20% Sn-80% Au eutectic layer from the diffusion bonding to and/or from the upper and lower gold layers.

The analysis of the other tin-based phase diagrams indicates that they are not as interesting as pure tin.

An analysis of various gold-based phase diagrams indicates that many low temperature gold-based eutectic metals have a low eutectic temperature of less than about 400° C.

Figure 34:
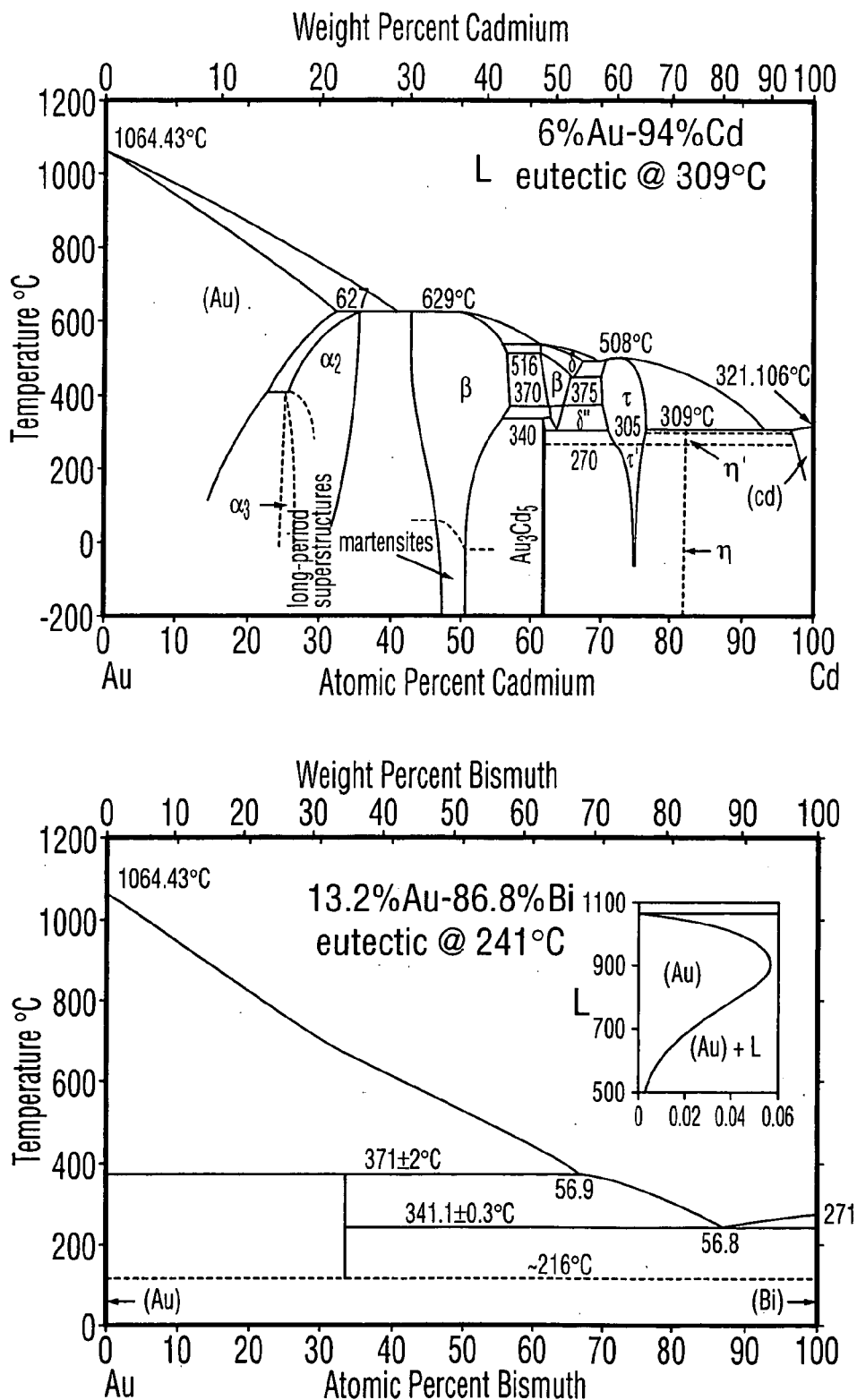
FIG. 34 is a diagram of gold-based metals having an eutectic ° T of less than 400° C.

FIG. 34 shows the gold-based metals having an eutectic ° T of less than 400° C., namely: Gold-Tin, with a 80% Au-20% Sn eutectic point @ 282° C.; Gold-Cadmium, with a 6% Au-94% Cd eutectic point @ 309° C.; and Gold-Bismuth, with a 13.2% Au-86.8% Bi eutectic point @ 241° C.

The Gold-Cadmium and Gold-Bismuth systems are also particularly interesting because the large proportion of gold in the 6% Au-94% Cd eutectic composition and in the 13.2% Au-86.8% Bi eutectic composition also indicate that pressing a pure layer of gold against a pure layer of cadmium at a temperature much higher than 309° C. and cooling toward 309° C. or of bismuth at a temperature much higher than 241° C. and cooling of toward 241° C. will cause the inter-mixing of the pairs of metals at the gold-cadmium or gold-bismuth interfaces; result in the consumption of the interface by gold, thus resulting in the formation of a gold-rich alloy near the gold-side of the cadmium-gold or bismuth-gold interface; result in the consumption of the interface by cadmium or tin, thus resulting in the formation of a cadmium-rich alloy or of a bismuth-rich alloy near the tin-side of the gold-cadmium or gold/bismuth interface; and result in a diffusion bonding with a high strength bonding at the inter-mixed gold-cadmium or gold-bismuth interface. The bismuth can also be present as an alloy or compound.

The plating of a pure cadmium layer of optimized thickness (about 6.3 µm to completely consume the 0.2 µm of gold from the cap wafer and the 0.2 µm of gold from the base wafer and form a 6% Au-94% Cd eutectic) over the gold layer of the cap wafer will result in the formation of an excellent bond when this cadmium layer will be pressed at high temperature between the gold layer of the cap wafer and the gold layer of the base wafer. Similarly, the plating of a pure bismuth layer of optimized thickness (about 2.6 µm as to completely consume the 0.2 µm of gold from the cap wafer and the 0.2 µm of gold from the base wafer and form a 13.2% Au-86.8% Bi eutectic) over the gold layer of the cap wafer will result in the formation of an excellent bonding when this bismuth layer will be pressed at high temperature between the gold layer of the cap wafer and the gold layer of the base wafer The low temperature eutectic metal to be deposited by electrolytic plating over the 0.2 µm thick 24 kt pure soft gold could then be approximately 0.1 µm thick for tin, a 6.3 µm thick for cadmium or 2.6 µm thick for bismuth. The result is a diffusion bonding of the metal layer to the upper and lower gold layer.

Referring again to FIG. 30b, the plating mask is removed using an oxygen plasma in step k. Since the 0.1 µm thick tin, the 6.3 µm thick cadmium or the 2.6 µm thick bismuth is exposed to the oxygen plasma during this mask removal, a protective photoresist layer 60 is coated, exposed and developed to protect the 0.1 µm thick tin, the 6.3 µm thick cadmium or the 2.6 µm thick bismuth low temperature eutectic metal during the removal of the seed layer and of the diffusion barrier layer.

The seed layer 55 is removed by wet etching at step m.

The barrier metal layer 54 is removed by wet etching at step n to leave a clean silicon surface 61 in the region to be sealed with the wafer-level package. This allows the cap wafer to be transparent in the infrared region of the electromagnetic spectra and allows the fabrication of high performance Photonics MEMS.

The photoresist layer 60 protecting the 0.1 µm thick tin, the 6.3 µm thick cadmium or the 2.6 µm thick bismuth low temperature eutectic metal is removed. Special precautions should be taken to reduce the natural oxide that grows on the surface of these layers prior the bonding to avoid blocking the bonding reaction.

The cap wafer is now ready for bonding to the base wafer.

Description of the Bonding Process of the Base Wafer to the Cap Wafer

Figure 35A:
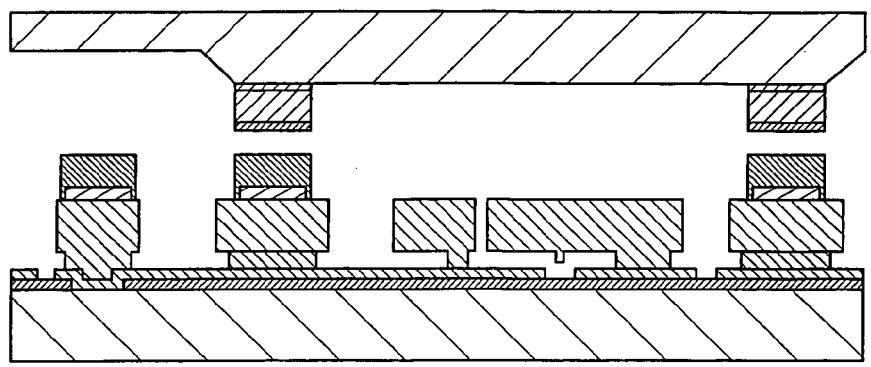
FIG. 35 illustrates the bonding of the base wafer to the cap wafer.
Figure 35B:
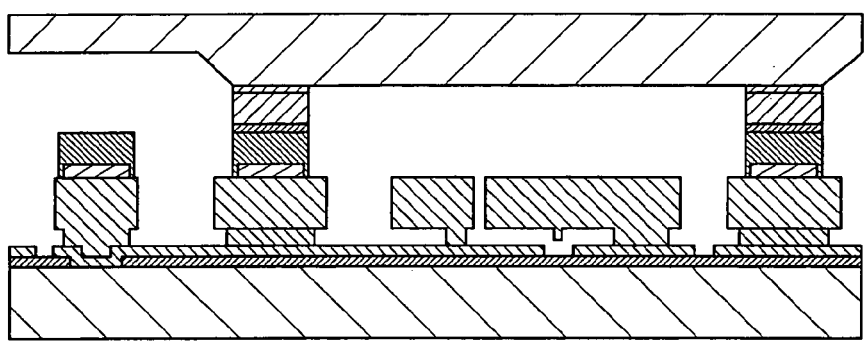
Figure 35C:
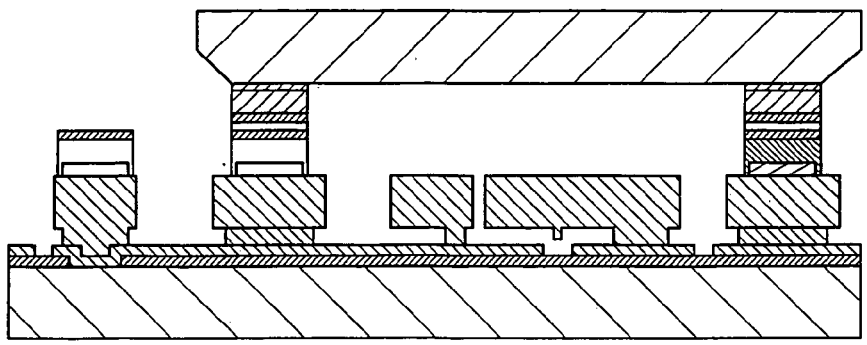

The bonding process can be performed in a commercial system such as the Electro Vision EVG-560. The bonding sequence involves:

In step a shown in FIG. 35, the alignment of the gold metal ring of the base wafer to the low temperature eutectic metal of the bonding ring of the cap wafer. Before any contact between the two wafers, a vacuum degassing operation is performed at a temperature slightly higher than the gold-metal eutectic temperature and for a long enough period of time to sufficiently degas the materials to be sealed in the cavity but short enough to prevent excessive reaction between the low temperature eutectic layer and the gold layer of the cap wafer.

In step b, the gas mixture is set at the desired pressure or the vacuum is set at the desired value before contacting the two wafers. A force is applied to the two wafers so as to force the liquid eutectic mixture of the bonding ring to closely contact the gold ring of the base wafer. A typical force of about 2–10 N/(mm² of physical contact area) is applied and held so as to allow the diffusion bonding of the two substrates to be completed (i.e. allow the tin, cadmium or bismuth material to have completed its reaction with the 0.2 µm thick underlying gold layer and the 0.2 µm thick overlying gold layer. While holding this force, the pair of wafers is cooled below the eutectic point, thus preventing a potential de-bonding during cooling. The force is relieved and the pair of wafers is unloaded.

In step c, backgrinding and/or polishing of the back side of the cap wafer (now the top side of the bonded pair of wafers) is performed to completely expose the region outside the sealed cavity. Alternately, a high etch rate TMAH, a high etch rate Deep Reactive Ion Etch (DRIE) or a combination of these three techniques (Backgrinding, TMAH and DRIE) could be performed in order to eliminate the portion of the cap wafer located outside the Relieve force without any damage to the devices. At this point, the bonding is complete and the cap wafer is diffusion bonded, or brazed, to the base wafer with a welded interface where the micro-defects have disappeared, thus creating a leak-tight bonding around the vacuum sealed or sealed and controlled ambient cavity. The MEMS device is then ready for testing.

Prior to bonding of the base and cap wafers, the region is preferably exposed, at the moment the first wafer contacts the second wafer, to an environment of consisting of a vacuum, or a controlled ambient pressure consisting of an inert gas; an insulating gas, a forming gas; an oxide reduction gas; and a non-inert gas selected to perform a specific function in the cavity to be sealed as to obtain this environment inside said cavity. The inert gas can be nitrogen, helium, neon, argon, krypton, xenon or radon. The insulating gas can be sulfur hexafluoride ($SF_6$) or freons. The forming gas can be hydrogen.

Preferably at the moment of contact, the temperature of the base wafer is higher than the temperature of the cap wafer to ensure proper degassing of the components located in the formed cavity.

At the moment of contact between wafers, the liquid solution of the surface of the cap wafer is preferably permitted to fill microscopic defects, microscopic cracks, microscopic dimples, or microscopic depressions induced by the gold surface roughness of the base wafer.

During the bonding step, intimate contact between the liquid solution of the first wafer and the higher temperature gold, gold alloy or gold compound layer of the base wafer causes at least partial dissolution of the gold, gold alloy or gold compound layer of the first wafer into the liquid solution at the interface, thus increasing the proportion of gold in the liquid solution while reducing the amount of gold, gold alloy or gold compound of the first wafer. The temperature of the first and second wafers should preferably maintained while they are in contact with each other for a certain period of time so as to allow even more dissolution of the gold, gold alloy or gold compound layer of the base wafer to be dissolved into the liquid solution filling the micro-defects of the interface between the first wafer and second wafer. This period can be made long enough for additional dissolution of the gold, gold alloy or gold compound layer of the first wafer to be dissolved into the liquid solution filling the micro-defects of the interface between the two wafers.

The dissolution of the gold, gold alloy or gold compound layer of the first wafer can cause the complete consumption of the under-layer of gold, gold alloy or gold compound in the second wafer while maintaining the gold-enriched solution in a liquid state. The initial amount of gold, gold alloy or gold compound underlying the bismuth, bismuth alloy or bismuth compound over-layer of the cap wafer, the initial amount of gold, gold alloy or gold compound of the base wafer and the temperature of the contacted first wafer and second wafer define the actual composition of the liquid solution present at the vanishing interface and micro-defects.

The temperature of the contacted wafers should be such that, for the actual composition of the liquid solution defining the actual liquidus temperature of the gold-bismuth phase diagram, it approaches the liquidus temperature below which the first gold crystals or gold-bismuth intermetallic crystals will begin to precipitate. During the bonding step the temperature of the first wafer and second wafer is reduced after contact to cause the crystallization of crystals having a richer content of the material of the over-layer.

The material of the over-layer should be reduced to the lowest liquidus of the appropriate phase diagram. For example, in the case of bismuth, bismuth alloy or bismuth compound, the temperature is reduced to the lowest temperature liquidus of the gold-bismuth phase diagram, namely 241° C., where liquid phase has completely disappeared with the formation of crystals of 13.2% Au/86.8% Bi composition. In the case wherein the material of the over-layer is cadmium, cadmium alloy or cadmium compound, the temperature is reduced to the lowest temperature liquidus of the gold-bismuth phase diagram, namely 309° C., where liquid phase has completely disappeared with the formation of crystals of 6% Au/94% Cd composition. In the case wherein the material of the over-layer is tin, tin alloy or tin compound, the temperature is reduced to the lowest temperature liquidus of the gold-tin phase diagram, namely 282° C. (for 80% Au/20% Sn) or 217° C. (for 7% Au/93% Sn), where liquid phase has completely disappeared with the formation of crystals of 80% Au/20% Sn or of 7% Au/93% Sn composition.

The temperature of the bonded wafers is then reduced to room temperature and the cap wafer is micro-machined without damaging the underlying base wafer so as to remove the portion of the cap wafer outside the sealed cavity and to expose the region of the base wafer outside the cavity without damaging the seal of the cavity.

The micro-machining involves the use of one or more processes including grinding, polishing, a wet etch in TMAH, KOH, EDP, a plasma etch, a reactive ion etch, RIE, a deep reactive ion etch, DRIE, a mechanical blasting technique using silicon carbide, SiC other micro-beeds to remove the portion of the cap wafer outside the sealed cavity.

The obtained micro-machined bonded wafers result in a wafer-level packaged wafer. The wafer-level packaged wafer may incorporate one or more components including a silicon semiconductor device, a germanium semiconductor device, a silicon-germanium semiconductor device, a III–V compound semiconductor, optical device, a II–VI compound semiconductor, a silica photonic device, a plastic photonic device, a CMOS, DMOS, BCDMOS, Bipolar, BICMOS or other high-voltage driver or device, a micro-electro-mechanical system, a sensor, an actuator, an intelligent microsystem, a biochip, a laboratory on a chip, LOAC.

The wafer-level package allows at least one bonding pad located outside the sealed cavity to electrically thermally connect at least one component located the inside the sealed cavity. The back side of the base wafer can be subjected polishing and grinding to reduce the overall thickness thereof. The wafer-level package can then be diced by standard or slightly modified standard dicing techniques. The individual dies are then packaged in standard molded plastic packages and/or other standard packages.

Exemplary embodiments of the invention have been described. It will be understood by one skilled in the art that equivalent materials can be employed where appropriate and the steps and elements described may be used alone or in combination.

We claim:

1. A method of fabricating an integrated microdevice, comprising:
   providing a first silicon wafer;
   forming a first metal sealing ring on said first silicon wafer around a zone to be sealed;
   forming at least one bond pad outside said sealing ring and electrically connected to components inside said zone for establishing external electrical connections to said components;
   forming a first layer of gold or gold alloy on a surface of said first sealing ring;
   providing a second silicon wafer;
   forming a second metal sealing ring on said second silicon wafer;
   forming on a surface of said second metal sealing ring an under-layer of gold or gold alloy, and a solder over-layer selected from the group consisting of bismuth, cadmium, and tin;
   aligning said first and second sealing rings; and
   diffusion bonding said first and second silicon wafers together under pressure at said first and second metal sealing rings at a sufficient temperature to form a solution of gold or gold alloy and said solder at an interface between said first and second metal sealing rings such that said solder becomes consumed by said gold or gold alloy of said first layer and said under-layer to form a new layer comprising an alloy of said solder and said gold or gold alloy.

2. The method as claimed in claim 1, wherein said first wafer is a base wafer and said second wafer is a cap wafer.

3. A method of fabricating an integrated microdevice, comprising:
   providing a first silicon wafer;
   forming a first metal sealing ring an said first silicon wafer around a zone to be sealed;
   forming at least one bond pad outside said sealing ring and electrically connected to components inside said zone for establishing external electrical connections to said components;
   forming a gold layer on a surface of said first sealing ring;
   providing a second silicon wafer;
   forming a second metal sealing ring on said second silicon wafer;
   forming on a surface of said second metal sealing ring a gold under-layer, and a solder over-layer of bismuth;
   aligning said first and second sealing rings; and
   diffusion bonding said first and second silicon wafers together under pressure at said first and second metal sealing rings at a sufficient temperature to form a solution of gold and said solder at an interface between said first and second metal sealing rings.

4. The method as claimed in claim 2, wherein said over-layer is tin.

5. The method as claimed in claim 2, wherein said over-layer is deposited by electroless plating.

6. The method as claimed in claim 2, wherein said over-layer is deposited by a technique selected from the group consisting of: auto-catalytic plating, electrolytic plating, electroplating, evaporation, electron beam deposition, a lift-off technique, sputtering, chemical vapor deposition (CVD), plasma enhanced chemical vapor deposition (PECVD), and metallorganic chemical vapor deposition (MOCVD).

7. The method as claimed in claim 5, wherein said under-layer is deposited by immersion plating.

8. The method as claimed in claim 6, wherein said under-layer is deposited by a technique selected from the group consisting of: auto-catalytic plating, electrolytic plating, electroplating method, evaporation, electron beam deposition, a lift-off technique, sputtering, chemical vapor deposition (CVD), plasma enhanced chemical vapor deposition (PECVD), and metallorganic chemical vapor deposition (MOCVD).

9. The method as claimed in claim 1, wherein a barrier layer is deposited under said gold layer provided on said first wafer.

10. The method as claimed in claim 9, wherein said barrier layer is made of a material selected from the group consisting of titanium, Ti, tantalum, Ta, platinum, Pt, rhodium, Rh, palladium, Pd, ruthenium, Ru, titanium tungsten, TiW, titanium tungsten nitride TiW(N), titanium nitride, TiN, titanium carbide, TiC, titanium boride, TiB, tungsten nitride, WN, tungsten carbide, WC, tungsten boride, WB, tantalum nitride, TaN, tantalum carbide, TaC, tantalum boride, TaB, halfmium nitride, HfN, halfmium carbide, HfC, halfmium boride, HfB, or tungsten silicon nitride, WsiN.

11. The method as claimed in claim 9, wherein a spacer layer is deposited under said barrier layer.

12. The method as claimed in claim 11, wherein said spacer layer is made of a material selected from the group consisting of: gold, Au, nickel, Ni. nickel-phosphorus, Ni(P), nickel-palladium, Ni(Pd), chromium, Cr, copper, Cu, bismuth, Bi, cadmium, Cd or palladium-cobalt, PdCo.

13. The method as claimed in claim 12, wherein said spacer layer is deposited by electroless plating.

14. The method as claimed in claim 12, wherein said spacer layer is deposited by a technique selected from the group consisting of: auto-catalytic plating, electrolytic plating, electroplating method, evaporation, electron beam deposition, a lift-off technique, sputtering, chemical vapor deposition (CVD), plasma enhanced chemical vapor deposition (PECVD) or metallorganic chemical vapor deposition (MOCVD).

15. The method as claimed in claim 1, wherein if said over-layer is bismuth, said second wafer is heated to a temperature above 241° C. and not more than 450° C. prior to bonding said wafers; if said over-layer is cadmium, said second wafer is heated to a temperature above 309° C. and not more than 450° C. prior to bonding said wafers; and if said over-layer is tin, said second wafer is heated to a maximum temperature above 282° C. and not mote than 450° C. prior to bonding said wafers.

16. The method as claimed in claim 1, wherein the amount of material in said over-layer and the amount of gold in said the under-layer are such that the liquid solution remains liquid without precipitation of solids at said maximum temperature even if the complete consumption of said gold under-layer occurs due to interaction with said over-layer.

17. The method as claimed in claim 16, wherein the amount of material in the over-layer and the amount of gold in the under-layer are such that the liquid solution at said maximum temperature can dissolve an additional amount of extra gold equivalent to at least 10% of the amount of gold compound already dissolved in the liquid solution at said maximum temperature.

18. The method as claimed in claim 17, wherein the amount of extra gold that can be dissolved at said maximum temperature is determined from the combined system consisting of the unsaturated liquid solution of the second wafer and the gold layer of the first wafer.

19. The method as claimed in claim 18, wherein the temperature of the first wafer is higher than the temperature of the second wafer prior to said bonding step.

20. The method as claimed in claim 19, wherein the higher temperature of the first wafer is maintained prior to contact with said second wafer for a sufficient duration to allow adequate degassing of critical components of said first wafer.

21. The method as claimed in claim 20, wherein said adequate outgassing is determined by a substantially reduced generation of water vapor and hydrogen at said higher temperature.

22. The method as claimed in claim 20, wherein components of said base wafer are located in said zone forming a cavity after the bonding of first wafer and said second wafer.

23. The method as claimed in claim 22, wherein prior to bonding of said first and second wafers, said region is exposed, at the moment the first wafer contacts the second wafer, to an environment selected from the group consisting of: a vacuum, a controlled ambient pressure of: an inert gas; an insulating gas, a forming gas; an oxide reduction gas; and a non-inert gas selected to perform a specific function in the cavity to be sealed as to obtain this environment inside said cavity.

24. The method as claimed in claim 23, wherein said inert gas is selected from the group consisting of: nitrogen, helium, neon, argon, krypton, xenon or radon.

25. The method as claimed in claim 23, wherein said insulating gas is selected from the group consisting of: sulfur hexafluoride (SF6) and freons.

26. The method as claimed in claim 23, wherein said forming gas consists of hydrogen.

27. The method as claimed in claim 23, wherein the temperature of said first wafer is higher than the temperature of said second wafer at the moment of contact to ensure adequate degassing of the components located in the formed cavity.

28. The method as claimed in claim 27, wherein at the moment of contact between the first wafer and second base wafer, the liquid solution of the surface of the cap wafer is permitted to fill microscopic defects, microscopic cracks, microscopic dimples, or microscopic depressions induced by the gold surface roughness of the base wafer.

29. The method as claimed in claim 28, wherein during said bonding step, intimate contact between the liquid solution of the first wafer and the higher temperature gold layer of the base wafer causes at least partial dissolution of the gold layer of the first wafer into the liquid solution at the interface, thus increasing the proportion of gold in the liquid solution while reducing the amount of gold, gold alloy or gold compound of the first wafer.

30. The method as claimed in claim 29, wherein the temperature of the first and second wafers is maintained while they are in contact with each other for a certain period of time so as to allow even more dissolution of the gold, gold alloy or gold compound layer of the base wafer into the liquid solution filling the micro-defects of the interface between the first wafer and second wafer.

31. The method as claimed in claim 30, wherein the temperature of the contacted first and second wafers is maintained for a sufficient duration to permit additional dissolution of the goldlayer of the first wafer into the liquid solution filling the micro-defects of the interface between the two wafers.

32. The method as claimed in claim 31, wherein the dissolution of the gold layer of the first wafer causes the complete consumption of the under-layer of gold, gold alloy or gold compound in the second wafer while maintaining the gold-enriched solution in a liquid state, the initial amount of gold underlying the over-layer of the cap wafer, the initial amount of gold of the base wafer and the temperature of the contacted first wafer and second wafer defining the actual composition of the liquid solution present at the vanishing interface and micro-defects.

33. The method as claimed in claim 32, wherein the temperature of the contacted first wafer and second wafer is such that for the actual composition of the liquid solution defining the actual liquidus temperature of the gold-bismuth gold-cadmium or gold-tin phase diagram, it approaches the liquidus temperature below which the first gold crystals or gold-bismuth intermetallic, gold-cadmium or gold-tin phase crystals will begin to precipitate.

34. The method as claimed in claim 33, wherein during the bonding step the temperature of the first wafer and second wafer is reduced alter contact to cause the crystallization of crystals having a richer content of the material of said over-layer.

35. The method as claimed in claim 34, wherein said material of said over-layer is bismuth and temperature is reduced to the lowest temperature liquidus of the gold-bismuth phase diagram, namely 241° C., where liquid phase has completely disappeared with the formation of crystals of 13.2% Au/86.8% Bi composition.

36. The method as claimed in claim 34, wherein said material of said over-layer is cadmium and temperature is reduced to the lowest temperature liquidus of the gold-cadmium phase diagram, namely 309° C., where liquid phase has completely disappeared with the formation of crystals of 6% Au/94% Cd composition.

37. The method as claimed in claim 34, wherein said material of said over-layer is tin and temperature is reduced to the lowest temperature liquidus of the gold-tin phase diagram, namely 282° C. (for 80% Au/20% Sn) or 217° C. (for 7% Au/93% Sn), where liquid phase has completely disappeared withthe formation of crystals of 80% Au/20% Sn or of 7% Au/93% Sn composition.

38. The method as claimed in claim 34, wherein the temperature of the bonded wafers is reduced to room temperature and the cap wafer is micro-machined without damaging the underlying base wafer as to remove the portion of the cap wafer outside a sealed cavity within said wafers and to expose a region of the first wafer outside the cavity without damaging a seal thereof.

39. The method as claimed in claim 38, wherein the micro-machining involves the use of one or more processes selected from the group consisting of: grinding, polishing, a wet etch in TMAH, KOH, EDP, a plasma etch, a reactive ion etch, RIE, a deep reactive ion etch, DRIE, a mechanical blasting technique using silicon carbide, SiC other microbeads to remove the portion of the cap wafer outside the sealed cavity.

40. The method as claimed in claim 39, wherein the obtained micro-machined bonded wafers result in a wafer-level packaged wafer.

41. The method as claimed in claim 40, wherein the wafer-level packaged wafer incorporates one or more components selected from the group consisting of: a silicon semiconductor device, a germanium semiconductor device, a silicon-germanium semiconductor device, a III–V compound semiconductor, optical device, a II–VI compound semiconductor, a silica photonic device, a plastic photonic device, a CMOS, DMOS, BCDMOS, Bipolar, BiCMOS or other high-voltage driver or device, a micro-electro-mechanical system, a sensor, an actuator, an intelligent microsystem, a biochip, a laboratory on a chip, LOAC.

42. The method as claimed in claim 41, wherein the wafer-level package allows at least one bonding pad located outside the sealed cavity to electrically thermally connect at least one component located the inside the sealed cavity.

43. The method as claimed in claim 41, wherein the wafer-level package the back side of the base wafer is processed by a technique selected from the group consisting of: polishing and grinding to reduce the overall thickness thereof.

44. The method as claimed in claim 43, wherein the wafer-level package is diced by standard or slightly modified standard dicing techniques.

45. The method as claimed in claim 44, wherein the individual dies are packaged in standard molded plastic packages and/or other standard packages.

46. A method of fabricating an integrated microdevice, comprising the steps of:
fabricating a base wafer including a bonding pad located outside a zone to be sealed, a component inside said zone, a metal interconnect located at the perimeter of said zone, an anti-oxidation layer selectively deposited using immersion plating through a temporary mask, and an alignment structure;
fabricating a cap wafer including a metal-based scaling ring located at the perimeter of said zone, a gold layer selectively deposited over said metal-based interconnect using electrolytic plating through a temporary mask, a solder layer selectively deposited over the gold layer using electrolytic plating, an alignment structure and a recessed structure allowing the removal of the portion of this second wafer outside said zone; and
bonding said cap wafer and said base wafer together using said solder layer.

47. The method as claimed in claim 46, wherein said solder layer is selected from the group consisting of bismuth, bismuth alloy, and a compound of bismuth.

48. The method as claimed in claim 46, wherein said solder layer is selected from the group consisting of: cadmium, cadmium ahoy, a compound of cadmium compound, tin, tin alloy, and a compound of tin.

49. The method as claimed in claim 48, wherein a barrier layer is selectively deposited over said metal interconnect on said cap wafer using electroless plating through a temporary mask and said gold layer is deposited over said barrier layer.

50. The method as claimed in claim 49, wherein said gold layer is selectively deposited over said nickel baffler layer using immersion plating through a temporary mask.

51. The method as claimed in claim 46, wherein said bonding step occurs at a temperature of less than 400° C. and under vacuum or under a specific pressure of dry nitrogen, dry forming gas or dry sulfur hexafluoride ambient.

52. The method of claim 1, wherein the new layer comprising an alloy of the solder and said gold or gold alloy has a eutectic composition.

53. The method of claim 1, wherein said first layer and said underlayer are gold and said solder is tin.

54. The method of claim 1, wherein said first layer and said underlayer are gold, and said solder is bismuth.

55. The method of claim 1, wherein said first and second wafers are diffusion bonded together at a pressure of about 0.2–1.0 kg/mm$^2$.

* * * * *